(12) United States Patent
Chiang et al.

(10) Patent No.: US 12,426,519 B2
(45) Date of Patent: Sep. 23, 2025

(54) MEMORY DEVICES

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Chao-Ching Cheng, Hsinchu (TW); Tzu-Chiang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/669,541

(22) Filed: May 21, 2024

(65) Prior Publication Data

US 2024/0315152 A1    Sep. 19, 2024

Related U.S. Application Data

(60) Continuation of application No. 18/363,751, filed on Aug. 2, 2023, now Pat. No. 12,022,752, which is a division of application No. 17/371,123, filed on Jul. 9, 2021, now Pat. No. 11,903,334.

(60) Provisional application No. 63/175,539, filed on Apr. 15, 2021.

(51) Int. Cl.
*H10N 70/00* (2023.01)
*H10B 63/00* (2023.01)
*H10N 70/20* (2023.01)

(52) U.S. Cl.
CPC ........ *H10N 70/8413* (2023.02); *H10B 63/20* (2023.02); *H10N 70/011* (2023.02); *H10N 70/231* (2023.02); *H10N 70/826* (2023.02)

(58) Field of Classification Search
CPC .............................. H10N 70/841; H10B 63/20
See application file for complete search history.

(56) References Cited

U.S. PATENT DOCUMENTS

| | | | |
|---|---|---|---|
| 7,560,721 B1* | 7/2009 | Breitwisch | H10N 70/24 257/2 |
| 2005/0127347 A1* | 6/2005 | Choi | H10B 63/30 438/622 |
| 2018/0108835 A1* | 4/2018 | Huang | H10N 50/01 |
| 2022/0173312 A1* | 6/2022 | Adusumilli | H10N 70/231 |

* cited by examiner

*Primary Examiner* — Mounir S Amer
(74) *Attorney, Agent, or Firm* — JCIPRNET

(57) ABSTRACT

A method of forming a memory device includes the following operations. A first conductive plug is formed within a first dielectric layer over a substrate. A treating process is performed to transform a portion of the first conductive plug into a buffer layer, and the buffer layer caps the remaining portion of the first conductive plug. A phase change layer and a top electrode are sequentially formed over the buffer layer. A second dielectric layer is formed to encapsulate the top electrode and the underlying phase change layer. A second conductive plug is formed within the second dielectric layer and in physical contact with the top electrode. A filamentary bottom electrode is formed within the buffer layer.

20 Claims, 20 Drawing Sheets

MEMORY DEVICES

CROSS-REFERENCE TO RELATED APPLICATION

This application is a continuation application of and claims the priority benefit of a prior application Ser. No. 18/363,751, filed on Aug. 2, 2023. The prior application Ser. No. 18/363,751 is a divisional application of and claims the priority benefit of U.S. prior application Ser. No. 17/371, 123, filed on Jul. 9, 2021. The prior application Ser. No. 17/371,123 claims the priority benefit of U.S. provisional application Ser. No. 63/175,539, filed on Apr. 15, 2021. The entirety of each of the above-mentioned patent applications is hereby incorporated by reference herein and made a part of this specification.

BACKGROUND

Memory devices are used in integrated circuits for electronic applications, including radios, televisions, cell phones, and personal computing devices, as examples. A phase-change random-access memory (PCRAM) is a form of non-volatile random-access computer memory. PCRAM technology is based upon a material that can be either amorphous or crystalline at normal ambient temperatures. When the material is in the amorphous state, the material has a high electrical resistance. When the material is in the crystalline state, the material has a low electrical resistance. PCRAM devices have several operating and engineering advantages, including high speed, low power, non-volatility, high density, and low cost. While the existing PCRAM devices have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
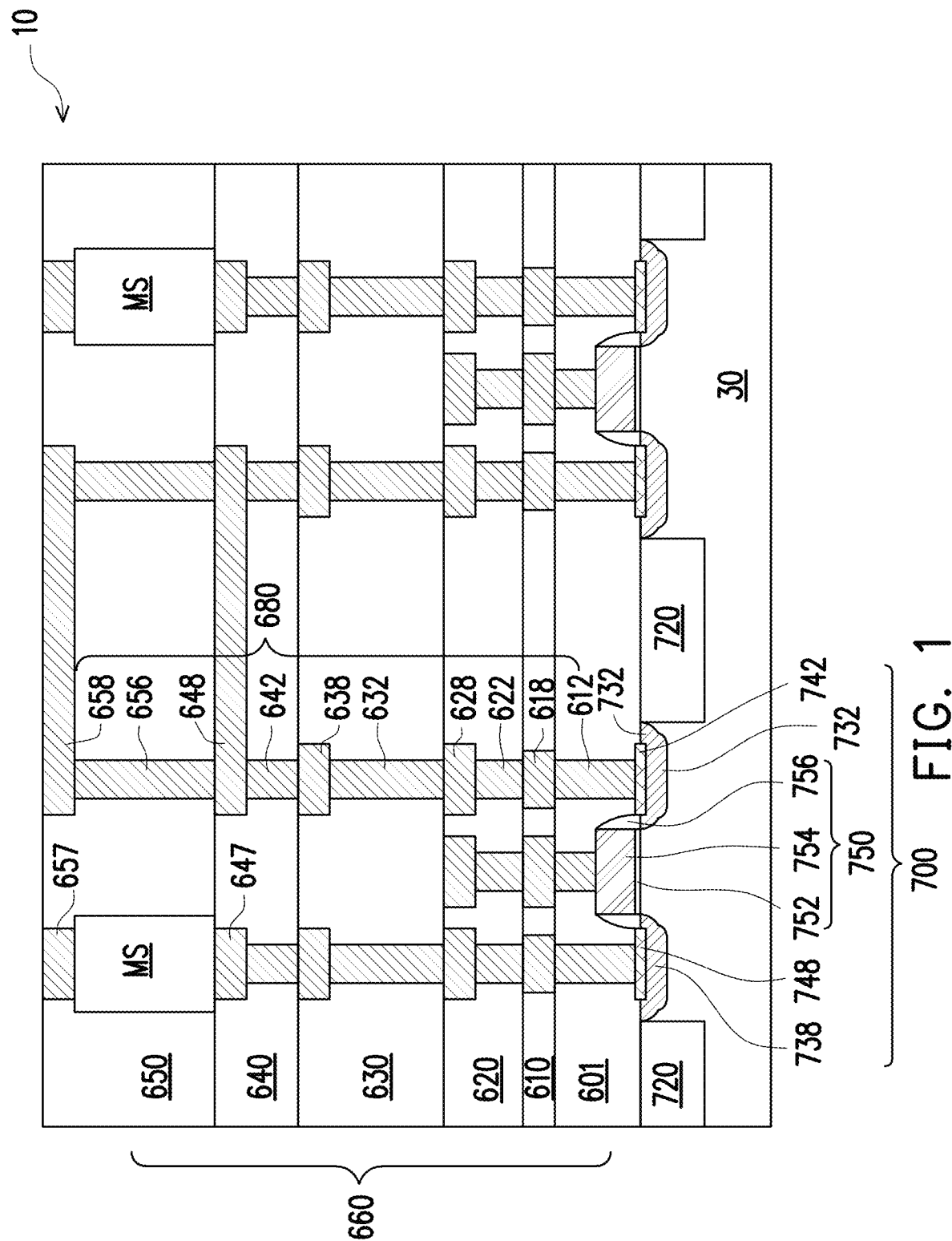
FIG. 1 illustrates a cross sectional view of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a memory device, such as a phase-change random access memory (PCRAM) device, and a method of forming the same. In the disclosure, a novel memory structure is proposed to confine the heat in PCRAM, so as to reduce operating current/voltage of PCRAM. The bottom electrode can be a filament. Such filament functions as a heater in some examples. The filamentary bottom electrode is beneficial to facilitate the phase change switching and improve the performance of the memory device.

Figure 2:
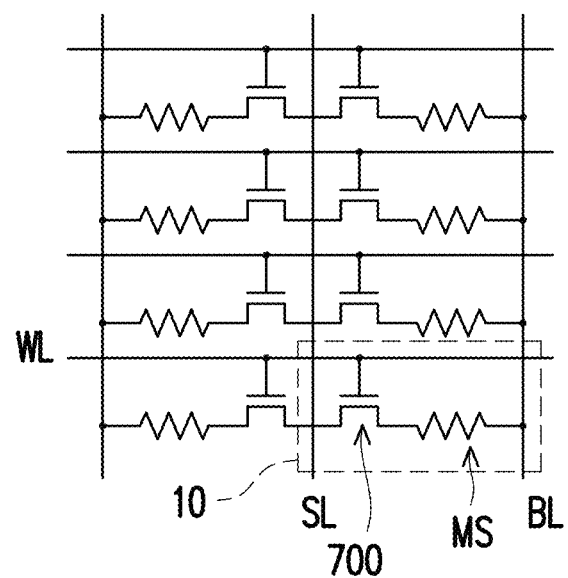
FIG. 2 illustrates a circuit diagram of a memory device according to some embodiments of the present disclosure.

FIG. 1 illustrates a cross sectional view of a memory device 10 according to various embodiments of the present disclosure. FIG. 2 illustrates a circuit diagram of the memory device 10 according to some embodiments of the present disclosure.

Referring to FIG. 1, the memory device 10 includes one or more phase-change memory cells or memory stacks MS and corresponding transistors 700 (e.g., field effect transistors) disposed on a substrate 30. The memory device 10 can include a two-dimensional array of memory cells each arranged in a 1T1MC configuration, i.e., a configuration in which one access transistor is connected to one memory cell.

The substrate 30 may be a semiconductor substrate such as a commercially available silicon substrate. Alternatively, or additionally, the substrate 30 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. Other suitable materials within the contemplated scope of disclosure may also be used.

The transistors 700 may provide functions that are needed to operate the memory cells 100. Specifically, the transistors 700 can be configured to control the programming operation, the erase operation, and the sensing (read) operation of the memory stacks MS. In some embodiments, the memory device 200 may include sensing circuitry and/or a top electrode bias circuitry on the substrate 30. The transistors 700 may include complementary metal-oxide-semiconductor (CMOS) transistors, MOSFET planar transistors, FinFETs, and/or Gate All Around (GAA) transistors. The substrate 30 may optionally include additional semiconductor devices (such as resistors, diodes, capacitors, etc.).

Shallow trench isolation structures 720 including a dielectric material such as silicon oxide can be formed in an upper portion of the substrate 30. Suitable doped semiconductor wells, such as p-type wells and n-type wells can be formed within each area that is laterally enclosed by a continuous portion of the shallow trench isolation structures 720. Accordingly, the transistors 700 may be formed on the substrate 30 between the isolation structures 720, such that the transistors 700 may be electrically isolated from one another by the isolation structures 720.

Each transistor 700 may include a source region 732, a drain region 738 and a gate structure 750. Each gate structure 750 can include a gate dielectric 752, a gate electrode 754, and a dielectric gate spacer 756. A source-side metal-semiconductor alloy region 742 can be formed on each source region 732, and a drain-side metal-semiconductor alloy region 748 can be formed on each drain region 738.

An interconnect structure 680 formed within interlayer dielectric (ILD) layers 660 may be formed over the substrate 30 and the devices formed thereon (such as the transistors 700). The ILD layers 660 can include, for example, a zeroth ILD layer 601, a first ILD layer 610, a second ILD layer 620, a third ILD layer 630, a fourth ILD layer 640, and a fifth ILD layer 650.

The interconnect structure 680 may be formed by performing any suitable deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process.

The interconnect structure may include conductive contacts 612 formed in the zeroth ILD layer 601 and that contact respective component of the transistors 700, first conductive lines 618 formed in the first ILD layer 610, first conductive vias 622 formed in a lower portion of the second ILD layer 620, second conductive lines 628 formed in an upper portion of the second ILD layer 620, second conductive vias 632 formed in a lower portion of the third ILD layer 630, third conductive lines 638 formed in an upper portion of the third ILD layer 630, third conductive vias 642 formed in a lower portion of the fourth ILD layer 640, fourth conductive lines 647/648 formed in an upper portion of the fourth ILD layer 640, fourth conductive vias 656 formed in a lower portion of the fifth ILD layer 650, and fifth conductive lines 657/658 formed in an upper portion of the fifth ILD layer 650. In one embodiment, the interconnect structure 680 includes source lines that are connected a source-side power supply for an array of memory elements. The voltage provided by the source lines can be applied to the bottom electrodes through the access transistors provided in the memory array region.

Each of the dielectric layers (601, 610, 620, 630, 640, 650) may include a low-k dielectric layer (e.g., a dielectric with a dielectric constant less than about 3.9), an ultra-low-k dielectric layer (e.g., a dielectric with a dielectric constant less than about 3.0 or less than about 2.0), or an oxide (e.g., silicon oxide). In some embodiments, each of the dielectric layers (601, 610, 620, 630, 640, 650) may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, a combination thereof, or the like, formed by any suitable method, such as spin-on coating, CVD, PECVD, ALD, a combination thereof, or the like.

Each of the metal feature (612, 618, 622, 628, 632, 638, 642, 647/648, 657/658) of the interconnect structure may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the metal contacts 612 and the first conductive lines 618 may be formed as integrated line and via structures by a dual damascene process, the second conductive vias 622 and the second conductive lines 628 may be formed as integrated line and via structures by a dual damascene process, the third conductive vias 632 and the third conductive lines 638 may be formed as integrated line and via structures by a dual damascene process, the fourth conductive vias 642 and the fourth conductive lines 648 may be formed as integrated line and via structures by a dual damascene process, and/or the fifth conductive vias 656 and the fourth conductive lines 648 may be formed as integrated line and via structures by a dual damascene process. Other suitable methods (e.g., multiple single damascene processes or electroplating processes) within the contemplated scope of disclosure may also be used.

In some embodiments, the memory stacks MS may be disposed within the fifth dielectric material layer 650, and each memory stack MS may be electrically connected to a respective fourth conductive line 647 and a fifth conductive line 657. However, the present disclosure is not limited to any particular location for the memory stacks MS. For example, the memory stacks MS may be disposed within any of the ILD layers 660.

The interconnect structure 680 may be configured to connect each memory stack MS to a corresponding transistor 700, and to connect the transistor 700 to corresponding signal lines. For example, the drain region 738 of the transistor 700 may be electrically connected to a bottom electrode (see FIG. 3F and FIG. 4F) of the memory stack MS through a subset of the conductive vias (612, 622, 632, 642) and a subset of the conductive lines (618, 628, 638, 648). Each drain region 738 may be connected to a first node (such as a bottom node) of a respective memory stack MS through a respective subset of the interconnect structure 680. The gate electrode 754 of each transistor 700 may be electrically connected to a word line WL (see FIG. 2), which can be embodied as a subset of the interconnect structure 680. A top electrode (see FIG. 3F and FIG. 4F) of each memory stack MS may be electrically connected to a respective bit line BL (sec FIG. 2), which is embodied as a respective subset of the interconnect structure. Each source region 732 may be electrically connected to a respective source line SL (see FIG. 2), which is embodied as a respective subset of the interconnect structure. In some embodiments, the adjacent transistors 700 share a common source line SL. While only five levels of conductive lines are illustrated in FIG. 1, it is understood that more conductive line levels can be formed above the illustrated levels of FIG. 1. Further, it is understood that the levels in which the source lines, word lines, and bit lines are formed may be selected based on design parameters.

In some embodiments, as shown in FIG. 1 and FIG. 2, the memory device 10 can include a two-dimensional array of memory cells each arranged in a 1T1MC configuration. Specifically, the memory device 10 includes a memory cell (e.g., memory stack MS) and a current-controlling device (e.g., transistor 700) connected together. The memory stack MS includes a phase-change material layer interposed between two electrodes. In one embodiment, the resistance of the phase-change layer material is configured to be adjusted into multiple levels that represent different logic states, respectively. During the operations of the memory device 10, the first terminal (gate) may be controlled by a first voltage from the word line WL, the second terminal may be controlled by a second voltage from the bit line BL, and the third terminal may be controlled by a third voltage from a source line SL.

The memory stacks MS may be configured in an array coupled with multiple source lines SL and multiple bit lines BL alternately arranged. In some embodiments, the conductive line 657 serves as a bit line BL, and the conductive line 658 serves a source line SL. However, the disclosure is not limited thereto. In other embodiments, the conductive line 657 serves as a source line SL, and the conductive line 658 serves a bit line BL. In one embodiment, the word lines WL and the bit lines BL may be cross-configured. Furthermore, each of the memory stacks MS may be operable to achieve multiple resistance levels and accordingly multiple bit storage. In the present embodiment, source lines SL are configured to connect to the sources of the transistors 700, respectively. In some embodiments, one source line SL may be coupled with a subset of the memory stacks MS in the memory structure 10, as shown in FIG. 2. However, the disclosure is not limited thereto. In other embodiments, the source lines SL may be configured such that one source line SL is coupled with one respective memory stack MS.

FIG. 3A to FIG. 3F illustrate cross sectional views of a method of forming a memory stack MS1 according to some embodiments of the present disclosure. The memory stack MS1 may be included in the memory device 10 of FIG. 1, according to various embodiments of the present disclosure. The memory stack MS1 may be disposed between two overlapping conductive lines, such as conductive lines 647 and 657. With respect to the memory stack MS1, the conductive lines 647, 657 may be respectively referred to herein as a bottom conductive line 647 and a top conductive line 657.

Figure 3A:
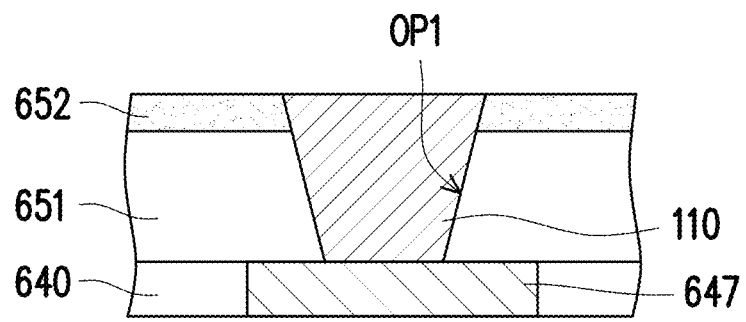
FIG. 3A to FIG. 3F illustrate cross sectional views of a method of forming a memory stack according to some embodiments of the present disclosure.

Referring to FIG. 3A, a conductive plug 110 is formed within a dielectric layer 651 over a subset of the interconnect structure 680. In some embodiments, the conductive plug 110 is formed over the conductive line 647 embedded by the ILD layer 640.

In some embodiments, the dielectric layer 651 and an optional cap layer 652 are sequentially formed over the ILD layer 640. The dielectric layer 651 may include a low-k dielectric layer (e.g., a dielectric with a dielectric constant less than about 3.9), an ultra-low-k dielectric layer (e.g., a dielectric with a dielectric constant less than about 3.0 or less than about 2.0), or an oxide (e.g., silicon oxide). The dielectric layer 651 may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, a combination thereof, or the like, formed by any suitable method, such as spin-on coating, CVD, PECVD, ALD, a combination thereof, or the like. The cap layer 652 may include oxide (such as silicon oxide, aluminum oxide, or the like), nitride (such as SiN, or the like), oxynitride (such as SiON, or the like), oxycarbide (such as SiOC, or the like), carbonitride (such as SiCN, or the like), carbide (such as SiC, or the like), a combination thereof, or the like, and may be formed using spin-on coating, CVD, PECVD, ALD. In some embodiments, the cap layer 652 and the dielectric layer 651 include different materials. In certain embodiments, the dielectric layer 651 includes silicon oxide, and the cap layer 652 includes silicon nitride.

Thereafter, an opening pattern OP1 is formed through the cap layer 652 and the dielectric layer 651, and exposes the underlying conductive line 647. Afterwards, a conductive material is formed over the dielectric layer 651 filling the opening pattern OP1. The conductive material may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. In certain embodiments, the conductive material includes W or Cu. In some embodiments, a planarization process (e.g., CMP) is performed to the conductive material using the cap layer 652 as a polishing stop layer, so as to remove the conductive material outside of the opening pattern OP1.

In some embodiments, the top surface of the conductive plug 110 is substantially coplanar with the top surface of the cap layer 652 or the dielectric layer 651 (if the cap layer 652 is optionally omitted). Besides, each of the cap layer 652 and the dielectric layer 651 includes a dielectric material, so the cap layer 652 and the dielectric layer 651 can be together referred to as a "first dielectric layer" in some examples.

Figure 3B:
Figure 3B:
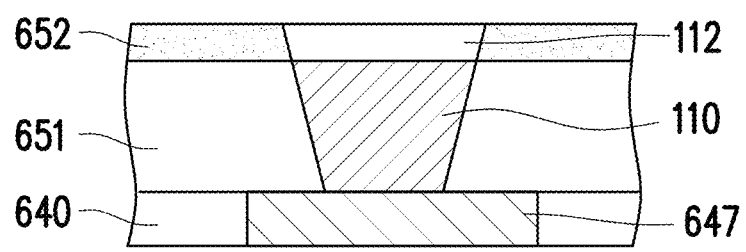

Referring to FIG. 3B, a treating process P1 is performed to transform a portion of the conductive plug 110 into a buffer layer 112, and the buffer layer 112 caps the remaining portion of the conductive plug 110. Specifically, the exposed portion (e.g., top surface portion) of the conductive plug 110 is subjected to the treating process P1, so the exposed portion of the conductive plug 110 is transformed into a treated portion serving as a buffer layer 112. In some embodiments, the buffer layer 112 is formed to have a horizontal bar shape.

In some embodiments, the treating process P1 is oxidation treatment, so the buffer layer 112 is oxide of the metal included in the conductive plug 110. In certain embodiments, the buffer layer 112 includes WO, CuO, or the like. In some embodiments, the bottom surface of the buffer layer 112 is rough and uneven, and the thickness of the buffer layer 112 is different from (e.g., thinner or thicker) or the same as the thickness of the adjacent cap layer 652.

In some embodiments, the treating process P1 includes performing a wet oxidation process at a temperature of about 25° C. to 100° C. The chemical compound for the wet oxidation process includes sulfuric acid ($H_2SO_4$), hydrogen peroxide ($H_2O_2$), phosphoric acid, hydrofluoric acid, the like, or a combination thereof. For example, the chemical compound for the wet oxidation process includes SPM (mixture solution of sulfuric acid and hydrogen peroxide solution).

In other embodiments, the treating process includes performing an oxygen annealing process at a temperature of about 400° C. to 600° C. The gas for the oxygen annealing process includes $O_2$, $O_3$, $N_2O$, $CO_2$ or a combination thereof. In some embodiments, the oxygen amount accounts for more than about 50 vol % (e.g., 70-90 vol %) of the total gas amount.

Figure 3C:
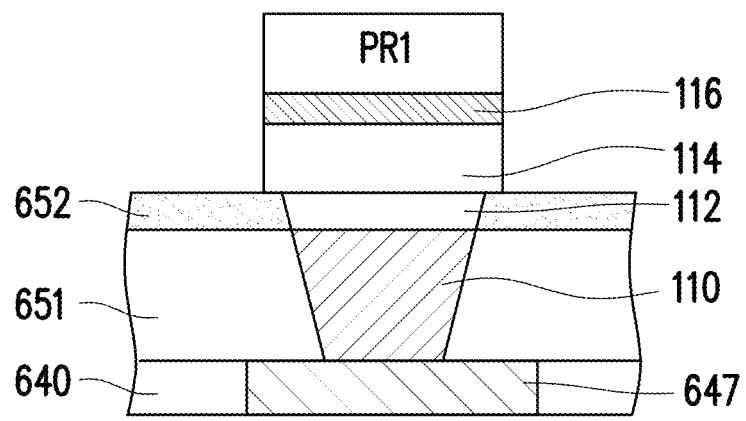

Referring to FIG. 3C, a phase change layer 114 and a top electrode 116 are sequentially formed on the buffer layer 112.

In some embodiments, a phase change material and a top electrode material are sequentially formed on the cap layer 652 covering the buffer layer 112. The phase change material may include one selected from the group consisting of Ge, Ga, Sn and In, and one or more selected from the group consisting of Sb and Te. In some embodiments, the material of the phase change material further includes one or more of nitrogen, bismuth and silicon oxide. For example, the phase change material is a binary system including GaSb, InSb, InSe, SbTe, GeTe or GeSb; a ternary system including GeSbTe, InSbTe, GaSeTe, SnSbTe, InSbGe or GaSbTe; or a quaternary system including GeSnSbTe, GeSbSeTe, TeGeSbS, GeSbTeO, or GeSbTeN. In certain embodiments, the phase change material is a GeSbTe alloy (e.g., $Ge_2Sb_2Te_5$) with or without doped by nitrogen and/or silicon oxide. The phase change material may include another phase change resistive material, such as metal oxides including tungsten oxide, nickel oxide, copper oxide, etc. The phase change material may have a single-layer or multi-layer structure.

The top electrode material may include aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, a metal alloy (e.g., an aluminum copper alloy), a suitable material, or a combination thereof.

Thereafter, a hard mask layer or a photoresist layer PR1 is formed on the top electrode material. Afterwards, the top electrode material and the phase change material are patterned by using the photoresist layer PR1 as an etching mask, so as to form the phase change layer 114 and the top electrode 116 on the buffer layer 112. The photoresist layer PR1 is then removed.

In some embodiments, the width of the phase change layer 114 is greater than the width of the buffer layer 112. However, the disclosure is not limited thereto. In other embodiments, the width of the phase change layer 114 is substantially the same as the width of the buffer layer 112. In some embodiments, the central axis of the stack including the phase change layer 114 and the top electrode 116 is aligned with the central axis of the buffer layer 112. In some embodiments, the phase change layer 114 completely covers the underlying buffer layer 112.

Figure 3D:
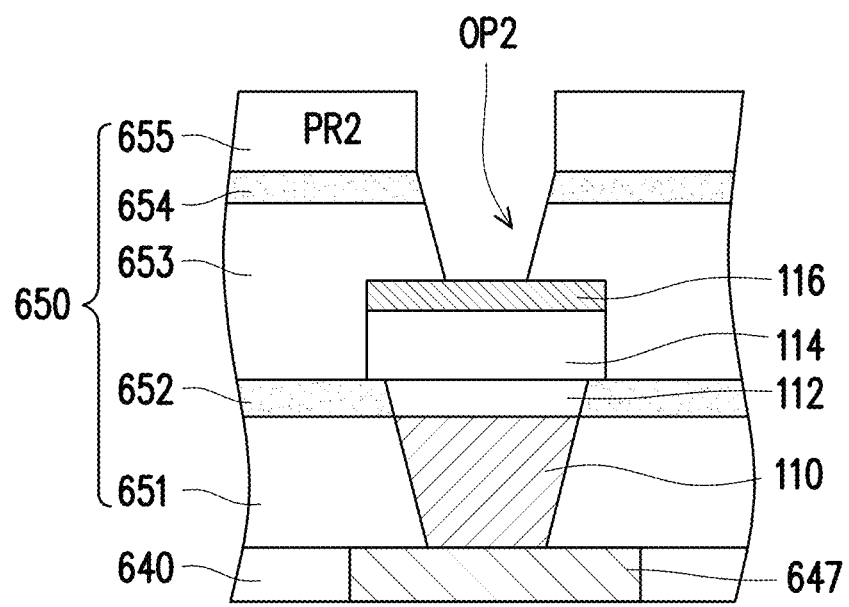

Referring to FIG. 3D, a dielectric layer 653 is formed on the dielectric layer 651 and covers the top electrode 116 and the underlying phase change layer 114. Thereafter, an optional cap layer 654 is formed on the dielectric layer 653. In some embodiments, the dielectric layer 653 and the cap layer 654 are made by materials similar to those of the dielectric layer 651 and the cap layer 652, so the details are not iterated herein.

Afterwards, a hard mask layer or a photoresist layer PR2 is formed on the cap layer 654. The photoresist layer PR2 has an opening pattern OP2 therein. Thereafter, a patterning process is performed by using the photoresist layer PR2 as an etching mask, so as to transfer the opening pattern OP2 of the photoresist layer PR2 into the underlying cap layer 654 and the dielectric layer 653. The opening pattern OP2 exposes a portion of the top electrode 116 upon the patterning process. The photoresist layer PR2 is then removed.

Figure 3E:
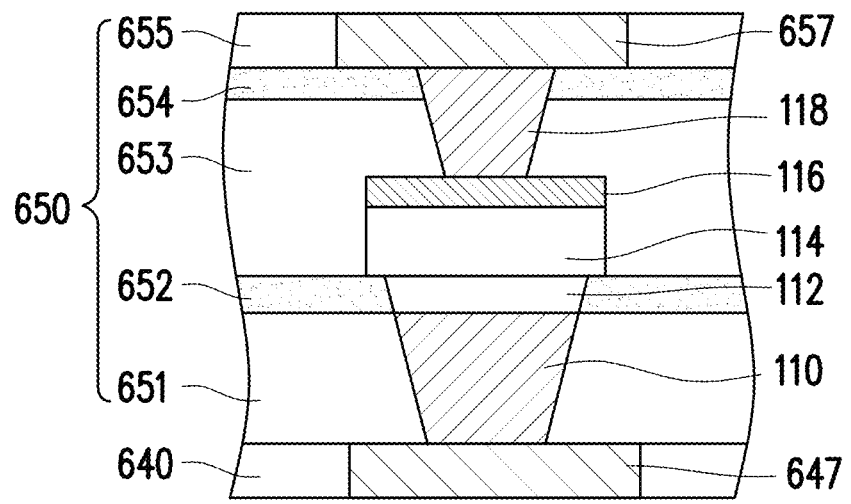

Referring to FIG. 3E, a conductive plug 118 is formed within the dielectric layer 653. In some embodiments, a conductive material is formed over the dielectric layer 653 filling the opening pattern OP2. The conductive material may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. In certain embodiments, the conductive material includes W or Cu. In some embodiments, a planarization process (e.g., CMP) is performed to the conductive material using the cap layer 654 as a polishing stop layer, so as to remove the conductive material outside of the opening pattern OP2.

In some embodiments, the top surface of the conductive plug 118 is substantially coplanar with the top surface of the cap layer 654 or the dielectric layer 653 (if the cap layer 654 is optionally omitted). Besides, each of the cap layer 654 and the dielectric layer 653 includes a dielectric material, so the cap layer 654 and the dielectric layer 653 can be together referred to as a "second dielectric layer" in some examples.

Thereafter, another subset of the interconnect structure 680 is formed over the dielectric layer 653 and in contact with the top electrode 118. In some embodiments, the conductive line 657 embedded by the dielectric layer 655 is formed over the conductive plug 118 within the dielectric layer 653.

Figure 3F:
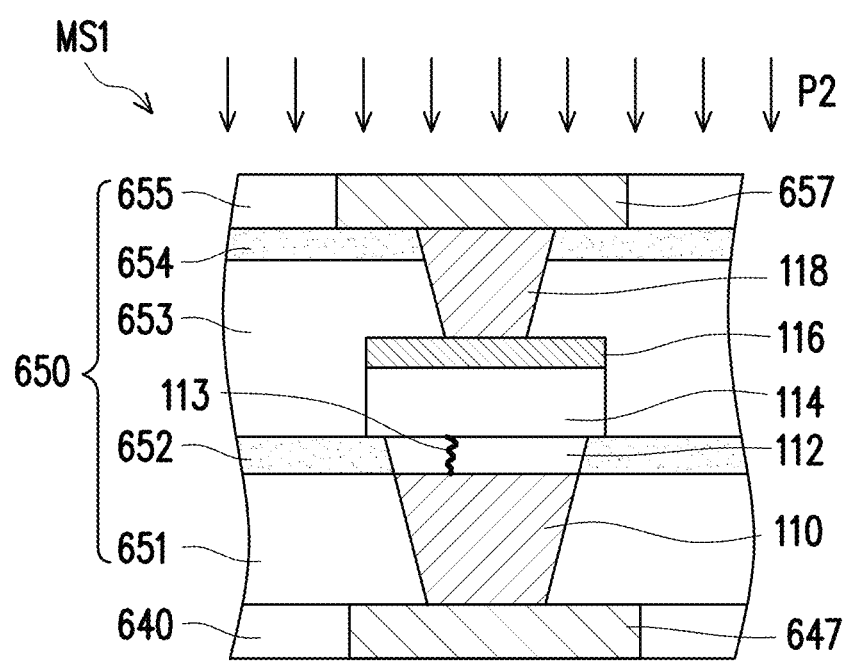

Referring to FIG. 3F, a filamentary bottom electrode 113 is formed within the buffer layer 112 after the formation of the interconnect structure 680. A memory device 10 including a memory stack MS1 is thus completed. In some embodiments, a voltage is applied to the memory device 10, so as to form the filamentary bottom electrode 113 within the buffer layer 112. Specifically, the filamentary bottom electrode 113 is a conductive pathway constituted by oxygen vacancies of the metal oxide buffer layer 112. The oxygen vacancies are generated within the metal oxide buffer layer 112 and form a filamentary conductive path serving a bottom electrode of the memory stack MS1. In some embodiments, the applied voltage ranges from about 0.7 V to 2 V. In some embodiments, a heating operation is performed to the memory device 10, so as to facilitate the formation of the filamentary bottom electrode 113. In some embodiments, the applied voltage ranges from about 0.7 V to 1 V or from about 0.8 V to 0.9 V at a temperature of about 200° C. to 500° C., such as 300° C. to 400° C. In some embodiments, the filamentary bottom electrode 113 is formed during the first firing or testing process.

The memory stack MS1 in the memory device 10 may be modified to have another configuration, as shown in FIG. 4A to FIG. 4F. The memory stacks MS2 is similar to the memory stack MS1, with similar features of the memory stacks being labeled with similar numerical references and descriptions of the similar features are not repeated herein.

Figure 4A:
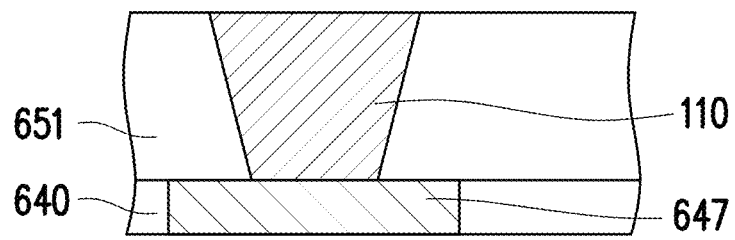
FIG. 4A to FIG. 4F illustrate cross sectional views of a method of forming a memory stack according to alternative embodiments of the present disclosure.

Referring to FIG. 4A, a conductive plug 110 is formed within a dielectric layer 651 over a subset of the interconnect structure 680. In some embodiments, the conductive plug 110 is formed over the conductive line 647 embedded by the ILD layer 640. In some embodiments, the top surface of the conductive plug 110 is substantially coplanar with the top surface of the dielectric layer 651.

Figure 4B:
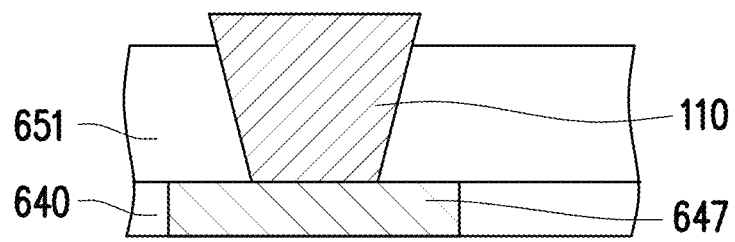

Referring to FIG. 4B, an etching back process is performed to the dielectric layer 651 until the top surface of the conductive plug 110 is higher than the top surface of the dielectric layer 651.

Figure 4C:
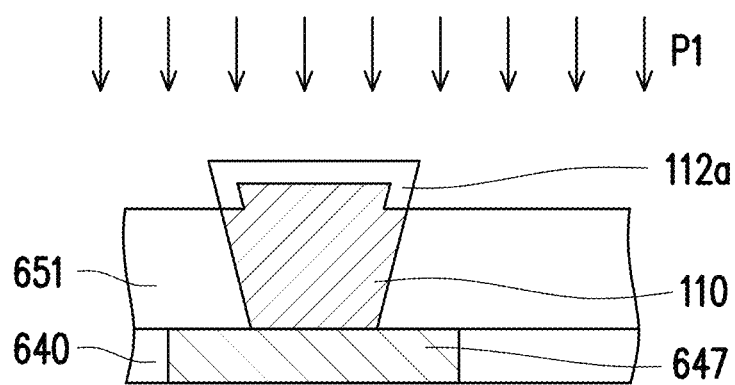

Referring to FIG. 4C, a treating process P1 is performed to transform a portion of the conductive plug 110 into a buffer layer 112a, and the buffer layer 112a caps the remaining portion of the conductive plug 110. Specifically, the exposed portion (e.g., top surface and upper sidewall portion) of the conductive plug 110 is subjected to the treating process P1, so the exposed portion of the conductive plug 110 is transformed into a treated portion serving as a buffer layer 112a. In some embodiments, the buffer layer 112a is formed to have multiple turning points.

In some embodiments, the treating process P1 is oxidation treatment, so the buffer layer 112a is oxide of the metal included in the conductive plug 110. In certain embodiments, the buffer layer 112a includes WO, CuO, or the like. In some embodiments, the bottom surface of the buffer layer 112a is rough and uneven.

In some embodiments, the treating process P1 includes performing a wet oxidation process at a temperature of 25° C. to 100° C. The chemical compound for the wet oxidation process includes sulfuric acid ($H_2SO_4$), hydrogen peroxide ($H_2O_2$), phosphoric acid, hydrofluoric acid, the like, or a combination thereof. For example, the chemical compound for the wet oxidation process includes SPM (mixture solution of sulfuric acid and hydrogen peroxide solution).

In other embodiments, the treating process includes performing an oxygen annealing process at a temperature of 400° C. to 600° C. The gas for the oxygen annealing process includes $O_2$, $O_3$, $N_2O$, $CO_2$ or a combination thereof. In some embodiments, the oxygen amount accounts for more than about 50 vol % (e.g., 70-90 vol %) of the total gas amount.

Figure 4D:
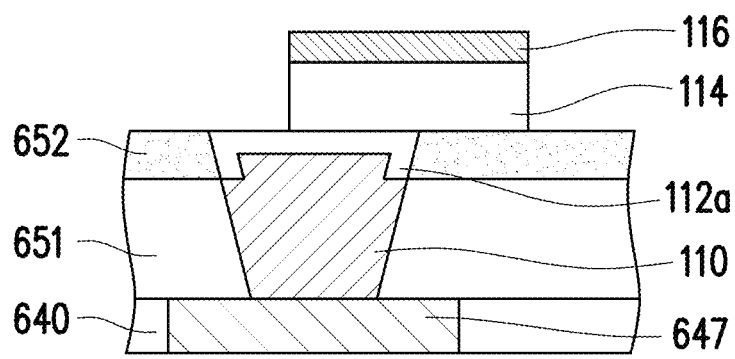

Referring to FIG. 4D, a cap layer 652 is formed on the dielectric layer 651 and surrounds the buffer layer 112a. In some embodiments, a cap material is formed over the dielectric layer 651 covering the buffer layer 112a, and a planarization process is performed to the cap material, until the top surface of the buffer layer 112a is exposed. In some embodiments, the top surface of the cap layer 652 is substantially coplanar with the top surface of the buffer layer 112a.

Thereafter, a phase change layer 114 and a top electrode 116 are sequentially formed on the buffer layer 112a. In some embodiments, the central axis of the stack including the phase change layer 114 and the top electrode 116 is misaligned with the central axis of the buffer layer 112a. For example, the phase change layer 114 partially covers the underlying buffer layer 112a. Specifically, the phase change layer 114 covers one turning point of the underlying buffer layer 112a while exposes another turning point of the underlying buffer layer 112a.

Figure 4E:
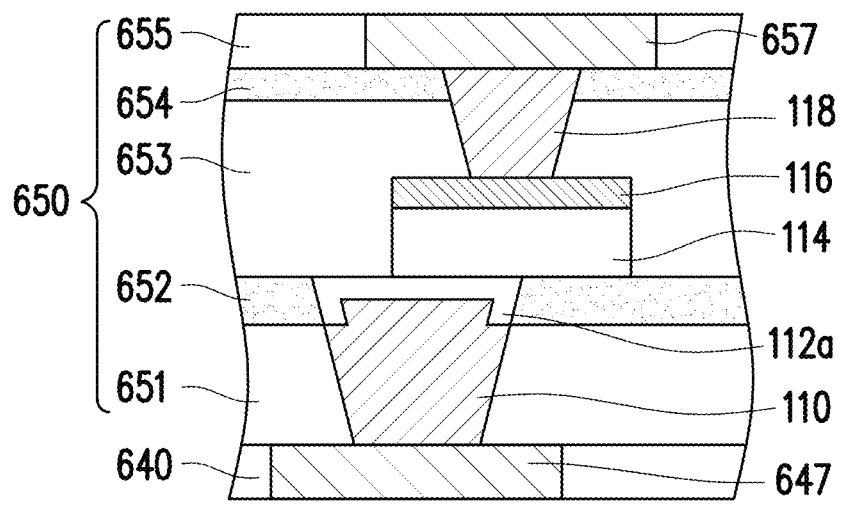

Referring to FIG. 4E, a dielectric layer 653 is formed on the dielectric layer 651 and covers the top electrode 116 and the underlying phase change layer 114. In some embodiments, the dielectric layer 653 is in contact with the exposed portion of the buffer layer 112a. Thereafter, an optional cap layer 654 is formed on the dielectric layer 653.

Thereafter, a conductive plug 118 is formed through the cap layer 654 and the dielectric layer 653, and physically contacts the top electrode 116.

Afterwards, another subset of the interconnect structure 680 is formed over the dielectric layer 653 and in contact with the top electrode 118. In some embodiments, the conductive line 657 embedded by the dielectric layer 655 is formed over the conductive plug 118 within the dielectric layer 653.

Figure 4F:
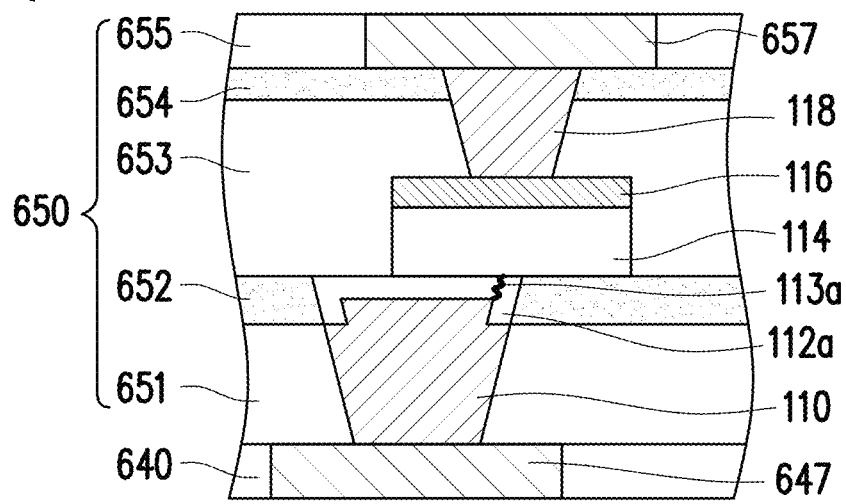

Referring to FIG. 4F, a filamentary bottom electrode 113a is formed within the buffer layer 112a after the formation of the interconnect structure 680. A memory device 10 including a memory stack MS2 is thus completed. In some embodiments, a voltage is applied to the memory device 10, so as to form the filamentary bottom electrode 113a within the buffer layer 112a. Specifically, the filamentary bottom electrode 113a is a conductive pathway constituted by oxygen vacancies of the metal oxide buffer layer 112a. The oxygen vacancies are generated within the metal oxide buffer layer 112a and form a filamentary conductive path serving a bottom electrode of the memory stack MS2. In some embodiments, the filamentary conductive path is formed around the turning point of the buffer layer 112a. In some embodiments, the applied voltage ranges from about 0.7 V to 2 V. In some embodiments, a heating operation is performed to the memory device 10, so as to facilitate the formation of the filamentary bottom electrode 113a. In some embodiments, the applied voltage ranges from about 0.7 V to 1 V or from about 0.8 V to 0.9 V at a temperature of about 200° C. to 500° C., such as 300° C. to 400° C. In some embodiments, the filamentary bottom electrode 113a is formed during the first firing or testing process.

Figure 5:
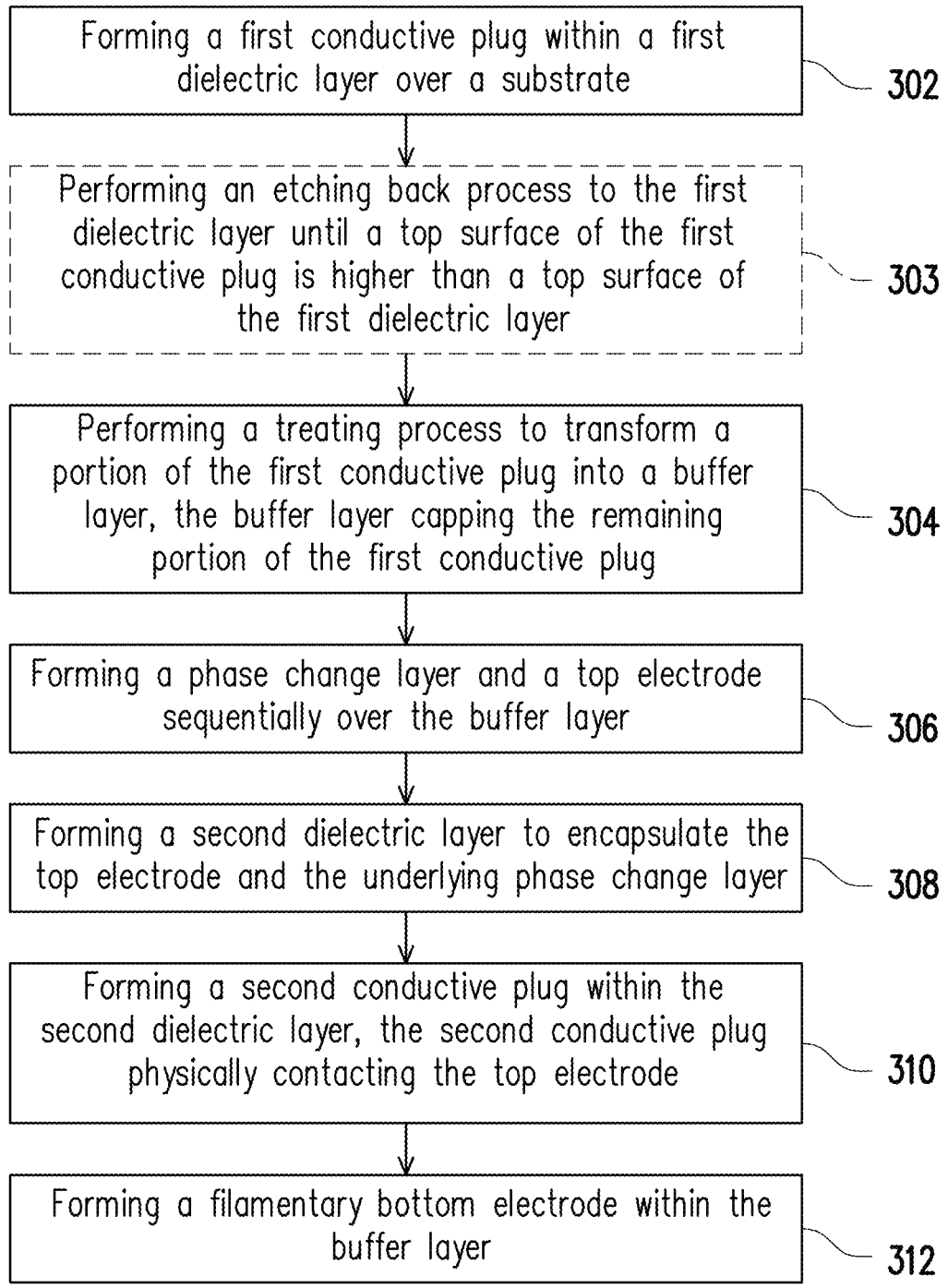
FIG. 5 illustrates a flow chart of a method of forming a memory device according to some embodiments of the present disclosure.

FIG. 5 illustrates a flow chart of a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a first conductive plug is formed within a first dielectric layer over a substrate. FIG. 3A and FIG. 4A illustrate cross-sectional views corresponding to some embodiments of act 302. In some embodiments, forming a first conductive plug within the first dielectric layer includes forming a first opening in the first dielectric layer, forming a first conductive material over the first dielectric layer filling the first opening, and performing a planarization process to the first conductive material by using the first dielectric layer as an etching mask, so as to form the first conductive plug in the first opening. In some embodiments, a top surface of the first conductive plug is substantially coplanar with a top surface of the first dielectric layer at act 302. The first dielectric layer may have a single-layer or multi-layer structure.

At act 303, an etching back process is performed to the first dielectric layer until a top surface of the first conductive plug is higher than a top surface of the first dielectric layer.

FIG. 4B illustrates a cross-sectional view corresponding to some embodiments of act 303. Act 303 is optional and may be omitted as needed.

At act 304, a treating process is performed to transform a portion of the first conductive plug into a buffer layer, and the buffer layer caps the remaining portion of the first conductive plug. FIG. 3B and FIG. 4C illustrate cross-sectional views corresponding to some embodiments of act 304. In some embodiments, the treating operation includes a wet oxidation process or an oxygen annealing process.

At act 306, a phase change layer and a top electrode are sequentially formed over the buffer layer. FIG. 3C and FIG. 4D illustrate cross-sectional views corresponding to some embodiments of act 306. In some embodiments, a blocking layer (e.g., silicon nitride, silicon oxynitride, silicon carbide etc.) is optionally formed on sidewalls of the phase change layer and the top electrode, so as to block humility from entering the phase change layer.

At act 308, a second dielectric layer is formed to encapsulate the top electrode and the underlying phase change layer. FIG. 3D and FIG. 4E illustrate cross-sectional views corresponding to some embodiments of act 308. The second dielectric layer may have a single-layer or multi-layer structure.

At act 310, a second conductive plug is formed within the second dielectric layer and in physical contact with the top electrode. FIG. 3D to FIG. 3E and FIG. 4E illustrate cross-sectional views corresponding to some embodiments of act 310.

At act 312, a filamentary bottom electrode is formed within the buffer layer. FIG. 3F and FIG. 4F illustrate cross-sectional views corresponding to some embodiments of act 312. In some embodiments, forming the filamentary bottom electrode within the buffer layer includes applying a voltage of about 0.8 V to 2V to the memory device. In some embodiments, forming the filamentary bottom electrode within the buffer layer further includes performing a heating operation at a temperature of about 200° C. to 500° C.

The structures of the memory devices of some embodiments are described below with reference to FIG. 1, FIG. 2, FIG. 3F and FIG. 4F.

In some embodiments, a memory device 10 includes a memory stack MS1/MS2. The memory stack MS1/MS2 includes a conductive plug 110, a phase change layer 114, a buffer layer 112/112a, a filamentary bottom electrode 113/113a, a top electrode 116 and a conductive plug 118. The conductive plug 110 is disposed on a conductive line 647 over a substrate 30. The phase change layer 114 is disposed over the conductive plug 110. The buffer layer 112/112a is disposed between the conductive plug 110 and the phase change layer 114. The filamentary bottom electrode 113/113a disposed within the buffer layer 112/112a and in physical contact with the conductive plug 110 and the phase change layer 114. The top electrode 116 is disposed over the phase change layer 114. The conductive plug 118 is disposed over the top electrode 116.

In some embodiments, a central axis of the phase change layer 114 is aligned with a central axis of the buffer layer 112. In some embodiments, a central axis of the phase change layer 114 is misaligned with a central axis of the buffer layer 112a.

In some embodiments, the buffer layer 112/112a covers a top surface of the conductive plug 110. In some embodiments, the buffer layer 112a further covers a portion of a side surface of the conductive plug 110. In some embodiments, the filamentary bottom electrode 113a is disposed around a turning point of the buffer layer 112a.

In some embodiments, the buffer layer 112/112a includes metal oxide. In some embodiments, the filamentary bottom electrode 113/113a includes oxygen vacancies.

Figure 6:
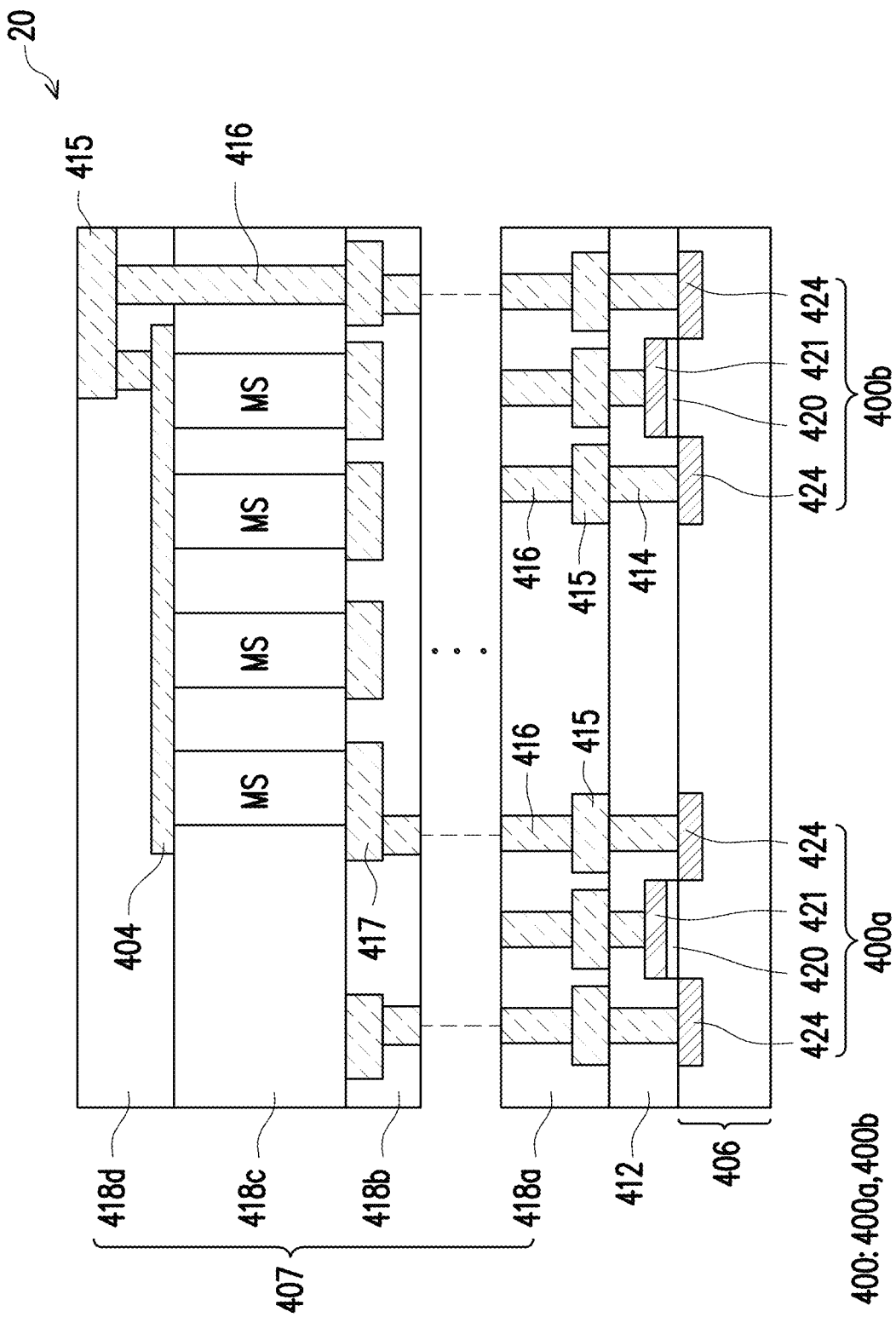
FIG. 6 illustrates a cross sectional view of a memory device according to other embodiments of the present disclosure.
Figure 7:
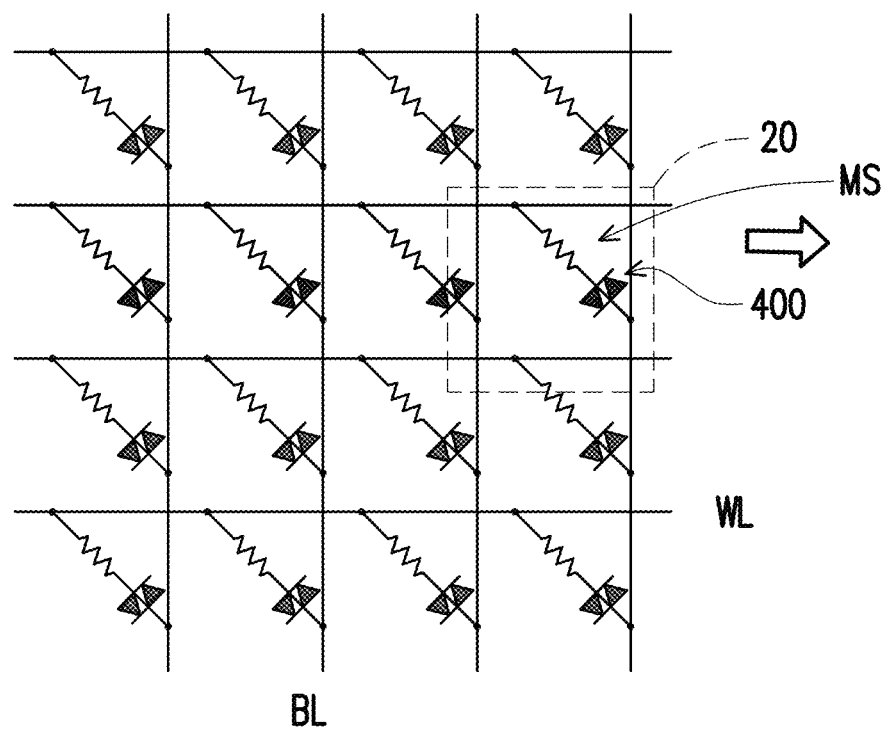
FIG. 7 illustrates a circuit diagram of a memory device according to other embodiments of the present disclosure.

FIG. 6 illustrates a cross sectional view of a memory device 20 according to other embodiments of the present disclosure. FIG. 7 illustrates a circuit diagram of the memory device 20 according to other embodiments of the present disclosure.

Referring to FIG. 6, the memory device 20 includes one or more phase-change memory cells or memory stacks MS and transistors 400 (e.g., field effect transistors) disposed on a substrate 406. In various embodiments, the memory stacks MS are disposed within the interconnect structure 407. The transistors 400 may include complementary metal-oxide-semiconductor (CMOS) transistors, MOSFET planar transistors, FinFETs, and/or Gate All Around (GAA) transistors.

The memory device 20 includes transistors 400 disposed on a substrate 406. Each transistor 400 respectively include a pair of source/drain regions 424 disposed in the substrate 406 and laterally spaced apart. A gate dielectric 420 is disposed over the substrate 406 between the individual source/drain regions 424, and a gate electrode 421 is disposed over the gate dielectric 420.

An interlayer dielectric (ILD) layer 412 is disposed over the transistors 400 and the substrate 406. The ILD layer 412 includes one or more ILD materials. Conductive contacts 414 are arranged within the ILD layer 412. The conductive contacts 414 extend through the ILD layer 412 to the gate electrode 421 and the pair of source/drain regions 424.

An interconnect structure 407 is disposed over the ILD layer 412. The interconnect structure 407 includes multiple ILD layers 418a-d. Multiple conductive lines 415 and multiple conductive vias 416 are disposed within the ILD layers 418a-d. The conductive lines 415 and conductive vias 416 are configured to provide electrical connections between various devices disposed throughout the memory device 20.

In some embodiments, the memory stacks MS are disposed within one of the ILD layers 418a-d. In further embodiments, the memory stacks MS may be disposed within multiple ILD layers 418a-d. The memory device 20 can include a two-dimensional array of memory cells each arranged in a 1S1MC configuration, i.e., a configuration in which one selector is connected to one memory cell.

The memory stack MS includes multiple conductive lines 404 (e.g., word lines). The conductive lines 404 each extend laterally in a first direction. In various embodiments, the conductive lines 404 are arranged in parallel with one another.

Multiple conductive lines 417 (e.g., bit lines) are arranged under the conductive lines 404. The conductive lines 417 each extend laterally in a second direction transverse the first direction. In various embodiments, the conductive lines 417 are arranged in parallel with one another.

Each of the dielectric layers (e.g., 612, 418a-d) may include a low-k dielectric layer (e.g., a dielectric with a dielectric constant less than about 3.9), an ultra-low-k dielectric layer (e.g., a dielectric with a dielectric constant less than about 3.0 or less than about 2.0), or an oxide (e.g., silicon oxide). In some embodiments, each of the dielectric layers (e.g., 612, 418a-d) may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, a combination thereof, or the like, formed by any suitable method, such as spin-on coating, CVD, PECVD, ALD, a combination thereof, or the like.

Each of the metal feature (e.g., 404, 414, 415, 416, 417) of the interconnect structure may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof, formed by any suitable method, such as dual damascene processes, single damascene processes or electroplating processes.

Multiple 1S1MC memory stacks MS are disposed between the conductive lines 404 and the conductive lines 417. In various embodiments, the memory stacks MS are arranged in an array having multiple rows and multiple columns. In some embodiments, an individual conductive line in the conductive lines 404 and an individual conductive line in the conductive lines 417 are coupled to each individual 1S1MC memory stack MS.

In some embodiments, the transistors 400 includes first transistors 400a and second transistors 400b. In various embodiments, there are M (wherein M is a whole number 1 or greater) conductive lines 417 and there are M first transistors 400a. Each of the conductive lines 417 are electrically coupled to an individual first transistor 400a (e.g., to a source/drain region 424 of each first transistor 400a) via conductive lines 415 and conductive vias 416 that are disposed beneath the memory stack MS. In various embodiments, there are N (wherein N is a whole number 1 or greater) conductive lines 404 and there are N second transistors 400b. Each of the conductive lines 404 are electrically coupled to an individual second transistors 400b (e.g., to a source/drain region 424 of each transistor 400b) via conductive lines 415 and conductive vias 416.

In some embodiments, as shown in FIG. 6 and FIG. 7, the memory device 20 can include a two-dimensional array of memory cells arranged in a 1S1MC configuration. Specifically, the memory device 20 includes memory cells (e.g., memory stacks MS). The memory stacks MS may be configured in an array coupled with multiple word lines WL and multiple bit lines BL are arranged in a cross configuration. In some embodiments, the conductive line 404 serve as word lines WL, and the conductive lines 417 serve as bit lines BL. However, the disclosure is not limited thereto. In other embodiments, the conductive line 404 serve as bit lines BL, and the conductive lines 417 serve as word lines WL.

FIG. 8A to FIG. 8F illustrate cross sectional views of a method of forming a memory stack MS3 according to some embodiments of the present disclosure. The memory stack MS3 may be included in the memory device 20 of FIG. 6, according to various embodiments of the present disclosure. The memory stack MS3 may be disposed between two overlapping conductive lines, such as conductive lines 417 and 404. With respect to the memory stack MS3, the conductive lines 417, 404 may be respectively referred to herein as a bottom conductive line 417 and a top conductive line 404.

Figure 8A:
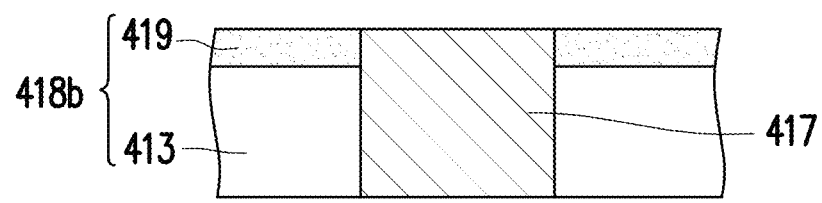
FIG. 8A to FIG. 8F illustrate cross sectional views of a method of forming a memory stack according to other embodiments of the present disclosure.

Referring to FIG. 8A, a conductive line 417 is formed within a dielectric layer 413 over a subset of the interconnect structure 407.

In some embodiments, the dielectric layer 413 and an optional cap layer 419 are sequentially formed over the ILD layer 418a. The dielectric layer 413 may include a low-k dielectric material having a dielectric constant lower than about 3.0, 2.0 or even 1.5. The dielectric layer 413 may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, a combination thereof, or the like, formed by any suitable method, such as spin-on coating, CVD, PECVD, ALD, a combination thereof, or the like. The cap layer 652 may include oxide (such as silicon oxide, aluminum oxide, or the like), nitride (such as SiN, or the like), oxynitride (such as SiON, or the like), oxycarbide (such as SiOC, or the like), carbonitride (such as SiCN, or the like), carbide (such as SiC, or the like), a combination thereof, or the like, and may be formed using spin-on coating, CVD, PECVD, ALD. In some embodiments, the cap layer 419 and the dielectric layer 413 include different materials. In certain embodiments, the dielectric layer 413 includes silicon oxide, and the cap layer 419 includes silicon nitride.

Thereafter, the conductive line 417 is formed through the cap layer 419 and the dielectric layer 413. The conductive line 417 may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. In certain embodiments, the conductive material includes W or Cu.

In some embodiments, the top surface of the conductive line 417 is substantially coplanar with the top surface of the cap layer 419 or the dielectric layer 413 (if the cap layer 419 is optionally omitted). Besides, each of the cap layer 419 and the dielectric layer 413 includes a dielectric material, so the cap layer 419 and the dielectric layer 413 can be together referred to as a "first dielectric layer" in some examples.

Figure 8B:
Figure 8B:
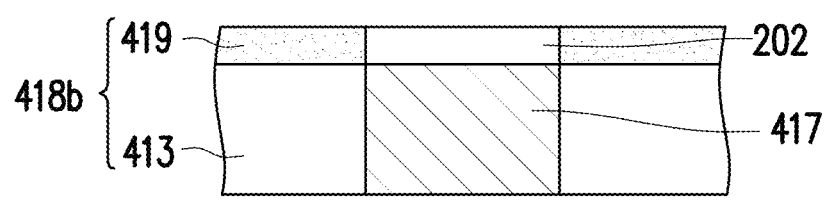

Referring to FIG. 8B, a treating process P1 is performed to transform a portion of the conductive line 417 into a buffer layer 202, and the buffer layer 202 caps the remaining portion of the conductive line 417. Specifically, the exposed portion (e.g., top surface portion) of the conductive line 417 is subjected to the treating process P1, so the exposed portion of the conductive line 417 is transformed into a treated portion serving as a buffer layer 202. In some embodiments, the buffer layer 202 is formed to have a horizontal bar shape.

In some embodiments, the treating process P1 is oxidation treatment, so the buffer layer 202 is oxide of the metal included in the conductive line 417. In certain embodiments, the buffer layer 202 includes WO, CuO, or the like. In some embodiments, the bottom surface of the buffer layer 202 is rough and uneven, and the thickness of the buffer layer 202 is different from (e.g., thinner or thicker) or the same as the thickness of the adjacent cap layer 419.

In some embodiments, the treating process P1 includes performing a wet oxidation process at a temperature of about 25° C. to 100° C. The chemical compound for the wet oxidation process includes sulfuric acid ($H_2SO_4$), hydrogen peroxide ($H_2O_2$), phosphoric acid, hydrofluoric acid, the like, or a combination thereof. For example, the chemical compound for the wet oxidation process includes SPM (mixture solution of sulfuric acid and hydrogen peroxide solution).

In other embodiments, the treating process includes performing an oxygen annealing process at a temperature of about 400° C. to 600° C. The gas for the oxygen annealing process includes $O_2$, $O_3$, $N_2O$, $CO_2$ or a combination thereof. In some embodiments, the oxygen amount accounts for more than about 50 vol % (e.g., 70-90 vol %) of the total gas amount.

Figure 8C:
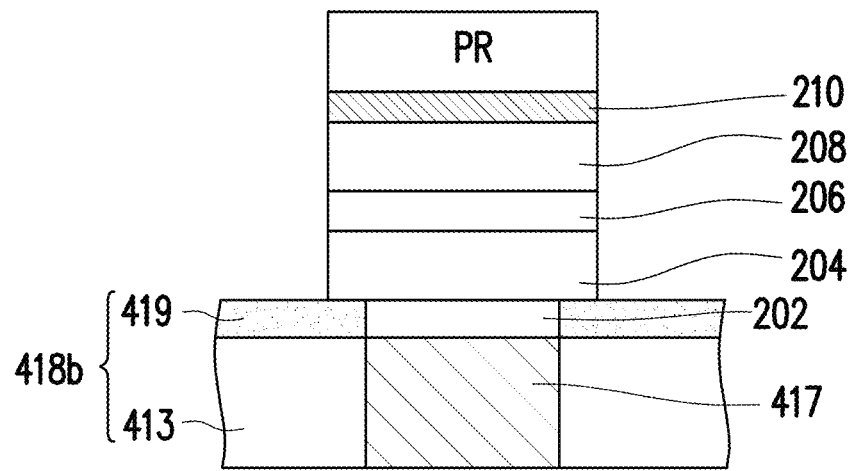

Referring to FIG. 8C, a phase change layer 204, an intermediate layer 206, a selector layer 208 and a top electrode 210 are sequentially formed on the buffer layer 202.

In some embodiments, a phase change material, an intermediate material, a selector material, and a top electrode material are sequentially formed on the cap layer 419 covering the buffer layer 202.

The phase change material may include one selected from the group consisting of Ge, Ga, Sn and In, and one or more selected from the group consisting of Sb and Te. In some embodiments, the material of the phase change material further includes one or more of nitrogen, bismuth and silicon oxide. For example, the phase change material is a binary system including GaSb, InSb, InSe, SbTe, GeTe or GeSb; a ternary system including GeSbTe, InSbTe, GaSeTe, SnSbTe, InSbGe or GaSbTe; or a quaternary system including GeSnSbTe, GeSbSeTe, TeGeSbS, GeSbTeO, or GeSbTeN. In certain embodiments, the phase change material is a GeSbTe alloy (e.g., $Ge_2Sb_2Te_5$) with or without doped by nitrogen and/or silicon oxide. The phase change material may include another phase change resistive material, such as metal oxides including tungsten oxide, nickel oxide, copper oxide, etc. The phase change material may have a single-layer or multi-layer structure.

The intermediate material may include tungsten (W), graphene, $MoS_2$, carbon (C), titanium (Ti), tantalum (Ta), tungsten nitride (WN), titanium nitride (TiN), tantalum nitride (TaN), the like, or a combination thereof. In some embodiments, the intermediate material functions as a heater, a heat sink or a thermal insulator for the phase change layer. The thermal insulator is beneficial to centralize heat in the phase change layer.

The selector material provides a current-voltage non-linearity to the PCRAM, and this reduces leakage current. In some embodiments, the selector material includes one or more selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In other embodiments, the selector material is made of a material including SiOx, TiOx, AlOx, WOx, TixNyOz, HfOx, TaOx, NbOx, the like, or a combination thereof, where x, y and z are non-stoichiometric values. In certain embodiments, the selector material is a chalcogenide or a solid-electrolyte material containing one or more of Ge, Sb, S, and Te. The selector material may have a single-layer or multi-layer structure.

The top electrode material may include aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, a metal alloy (e.g., an aluminum copper alloy), a suitable material, or a combination thereof.

Thereafter, a hard mask layer or a photoresist layer PR is formed on the top electrode material. Afterwards, the top electrode material, the selector material, the intermediate material and the phase change material are patterned by using the photoresist layer PR as an etching mask, so as to form the phase change layer 204, the intermediate layer 206, the selector layer 208 and the top electrode 210 on the buffer layer 202. The photoresist layer PR is then removed.

In some embodiments, the width of the phase change layer 204 is greater than the width of the buffer layer 202. However, the disclosure is not limited thereto. In other embodiments, the width of the phase change layer 204 is substantially the same as the width of the buffer layer 202. In some embodiments, the central axis of the stack including the phase change layer 204, the intermediate layer 206, the selector layer 208 and the top electrode 210 is aligned with the central axis of the buffer layer 202. In some embodiments, the phase change layer 204 completely covers the underlying buffer layer 202.

Figure 8D:
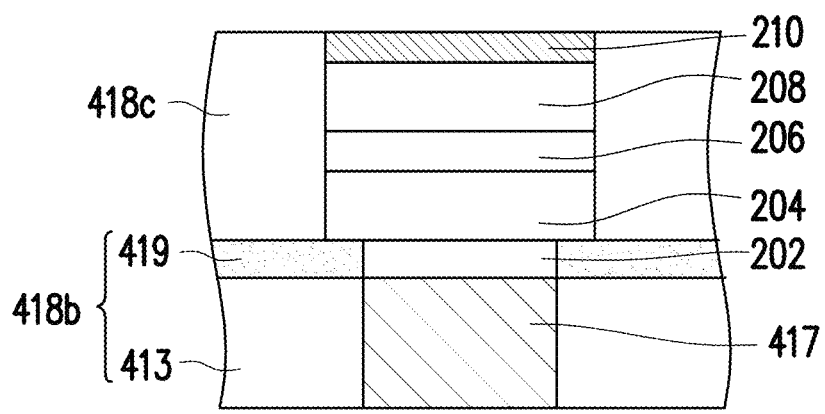

Referring to FIG. 8D, an ILD layer 418c is formed on the ILD layer 418b and surrounds the top electrode 210 and the underlying selector layer 208, the intermediate layer 206 and the phase change material 204. An optional cap layer is included in the ILD layer 418c as needed.

Figure 8E:
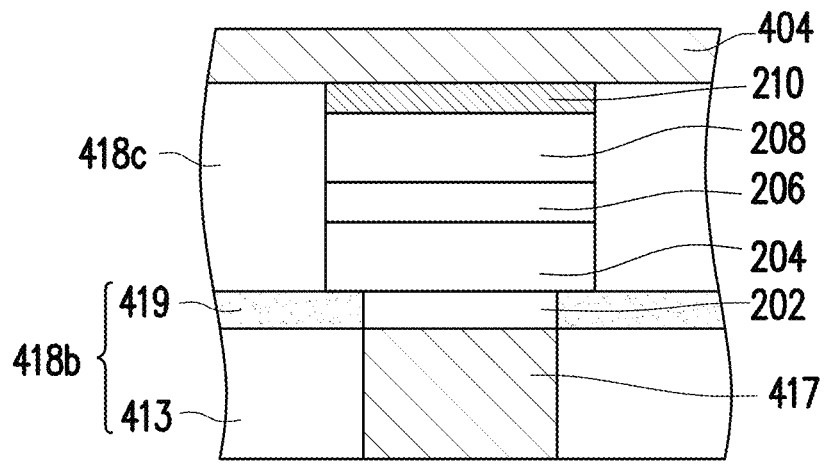

Referring to FIG. 8E, a subset of the interconnect structure 407 is formed over the ILD layer 418c and in contact with the top electrode 210. In some embodiments, the conductive line 404 embedded by the ILD layer 418d is formed over the top electrode 210, and the second conductive line 404 extends in a second direction different from the first direction.

Figure 8F:
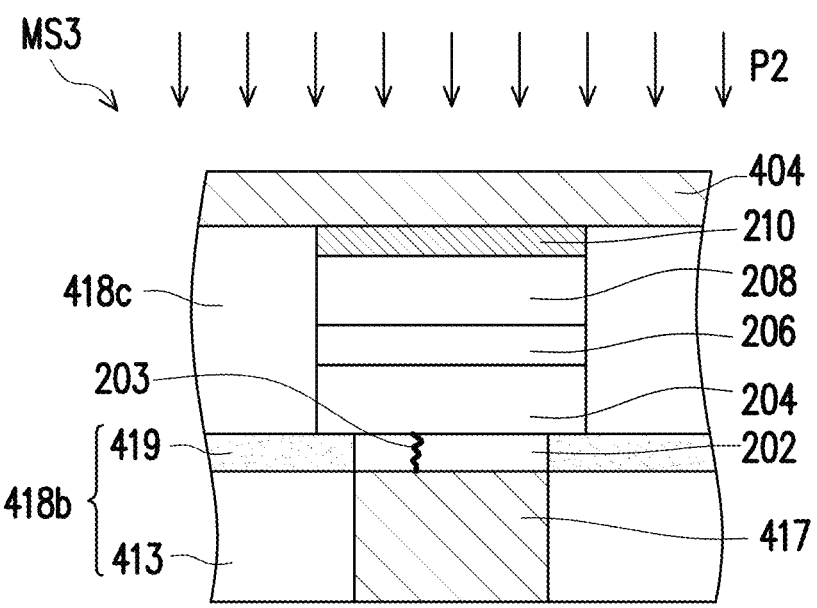

Referring to FIG. 8F, a filamentary bottom electrode 203 is formed within the buffer layer 202 after the formation of the interconnect structure 407. A memory device 20 including a memory stack MS3 is thus completed. In some embodiments, a voltage is applied to the memory device 20, so as to form the filamentary bottom electrode 203 within the buffer layer 202. Specifically, the filamentary bottom electrode 203 is a conductive pathway constituted by oxygen vacancies of the metal oxide buffer layer 202. The oxygen vacancies are generated within the metal oxide buffer layer 202 and form a filamentary conductive path serving a bottom electrode of the memory stack MS3. In some embodiments, the applied voltage ranges from about 0.7 V to 2 V. In some embodiments, a heating operation is performed to the memory device 10, so as to facilitate the formation of the filamentary bottom electrode 203. In some embodiments, the applied voltage ranges from about 0.7 V to 1 V or from about 0.8 V to 0.9 V at a temperature of about 200° C. to 500° C., such as 300° C. to 400° C. In some embodiments, the filamentary bottom electrode 203 is formed during the first firing or testing process.

The memory stack MS3 in the memory device 20 may be modified to have another configuration, as shown in FIG. 9A to FIG. 9F. The memory stacks MS4 is similar to the memory stack MS3, with similar features of the memory stacks being labeled with similar numerical references and descriptions of the similar features are not repeated herein.

Figure 9A:
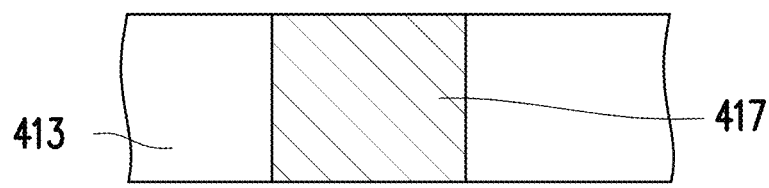
FIG. 9A to FIG. 9F illustrate cross sectional views of a method of forming a memory stack according to other embodiments of the present disclosure.

Referring to FIG. 9A, a conductive line 417 is formed within a dielectric layer 413 over a subset of the interconnect structure 407. In some embodiments, the top surface of the conductive line 417 is substantially coplanar with the top surface of the dielectric layer 413.

Figure 9B:
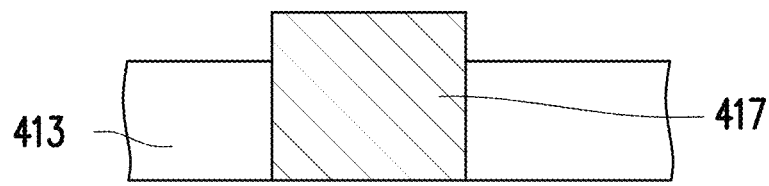

Referring to FIG. 9B, an etching back process is performed to the dielectric layer 413 until the top surface of the conductive line 417 is higher than the top surface of the dielectric layer 413.

Figure 9C:
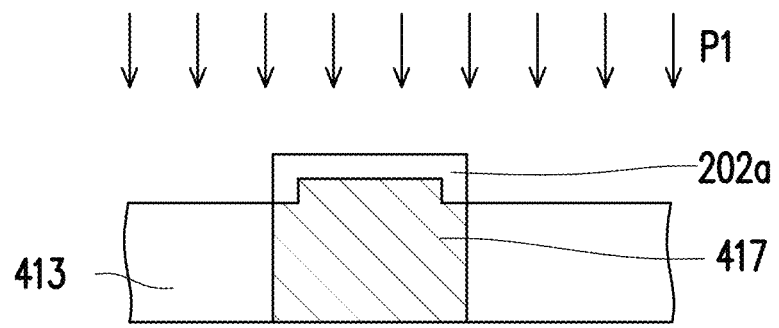

Referring to FIG. 9C, a treating process P1 is performed to transform a portion of the conductive line 417 into a buffer layer 202a, and the buffer layer 202a caps the remaining portion of the conductive line 417. Specifically, the exposed portion (e.g., top surface and upper sidewall portion) of the conductive line 417 is subjected to the treating process P1, so the exposed portion of the conductive line 417 is transformed into a treated portion serving as a buffer layer 202a. In some embodiments, the buffer layer 202a is formed to have multiple turning points.

In some embodiments, the treating process P1 is oxidation treatment, so the buffer layer 202a is oxide of the metal included in the conductive plug 110. In certain embodiments, the buffer layer 202a includes WO, CuO, or the like. In some embodiments, the bottom surface of the buffer layer 202a is rough and uneven.

In some embodiments, the treating process P1 includes performing a wet oxidation process at a temperature of 25° C. to 100° C. The chemical compound for the wet oxidation process includes sulfuric acid ($H_2SO_4$), hydrogen peroxide ($H_2O_2$), phosphoric acid, hydrofluoric acid, the like, or a combination thereof. For example, the chemical compound for the wet oxidation process includes SPM (mixture solution of sulfuric acid and hydrogen peroxide solution).

In other embodiments, the treating process includes performing an oxygen annealing process at a temperature of 400° C. to 600° C. The gas for the oxygen annealing process includes $O_2$, $O_3$, $N_2O$, $CO_2$ or a combination thereof. In some embodiments, the oxygen amount accounts for more than about 50 vol % (e.g., 70-90 vol %) of the total gas amount.

Figure 9D:
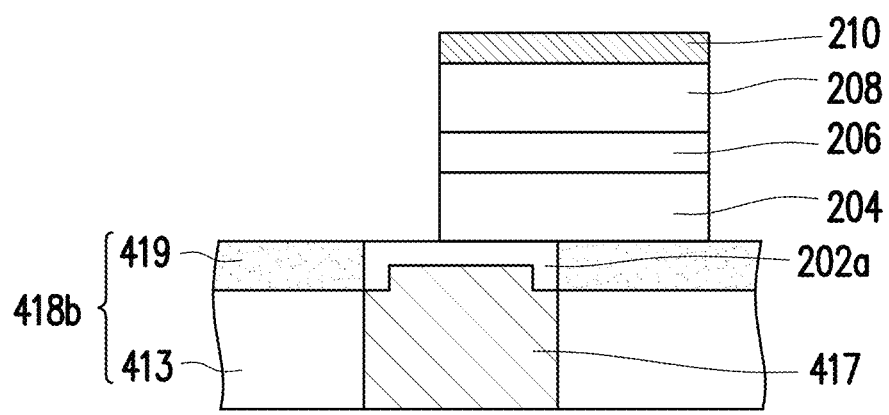

Referring to FIG. 9D, a cap layer 419 is formed on the dielectric layer 413 and surrounds the buffer layer 202a. In some embodiments, a cap material is formed over the dielectric layer 413 covering the buffer layer 202a, and a planarization process is performed to the cap material, until the top surface of the buffer layer 202a is exposed. In some embodiments, the top surface of the cap layer 419 is substantially coplanar with the top surface of the buffer layer 202a.

Thereafter, a phase change layer 204, an intermediate layer 206, a selector layer 208 and a top electrode 210 are sequentially formed on the buffer layer 202a. In some embodiments, the central axis of the stack including the phase change layer 204, the intermediate layer 206, the selector layer 208 and the top electrode 210 is misaligned with the central axis of the buffer layer 202a. For example, the phase change layer 204 partially covers the underlying buffer layer 202a. Specifically, the phase change layer 204 covers one turning point of the underlying buffer layer 202a while exposes another turning point of the underlying buffer layer 202a.

Figure 9E:
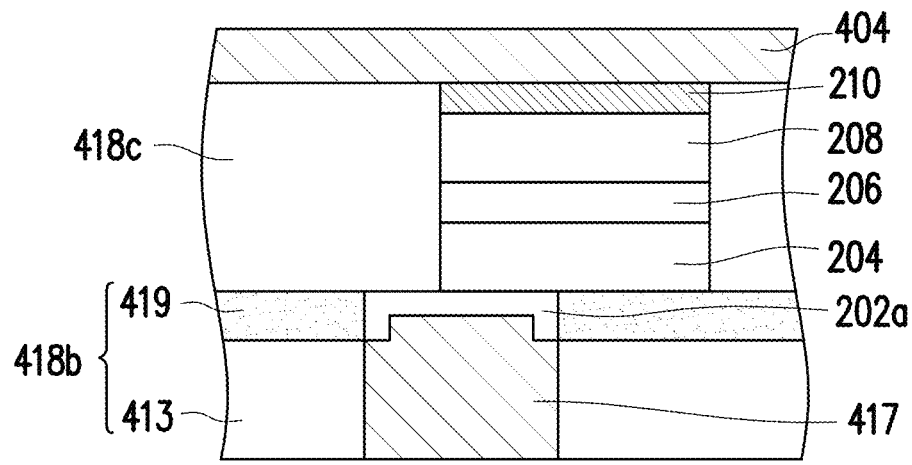

Referring to FIG. 9E, an ILD layer 418c is formed on the ILD layer 418b and surrounds the top electrode 210 and the underlying selector layer 208, the intermediate layer 206 and the phase change material 204. An optional cap layer is included in the ILD layer 418c as needed. In some embodiments, the ILD layer 418c is in contact with the exposed portion of the buffer layer 202a.

Afterwards, another subset of the interconnect structure 407 is formed over the ILD layer 418c and in contact with the top electrode 210. In some embodiments, the conductive line 404 embedded by the ILD layer 418d is formed over the top electrode 210.

Figure 9F:
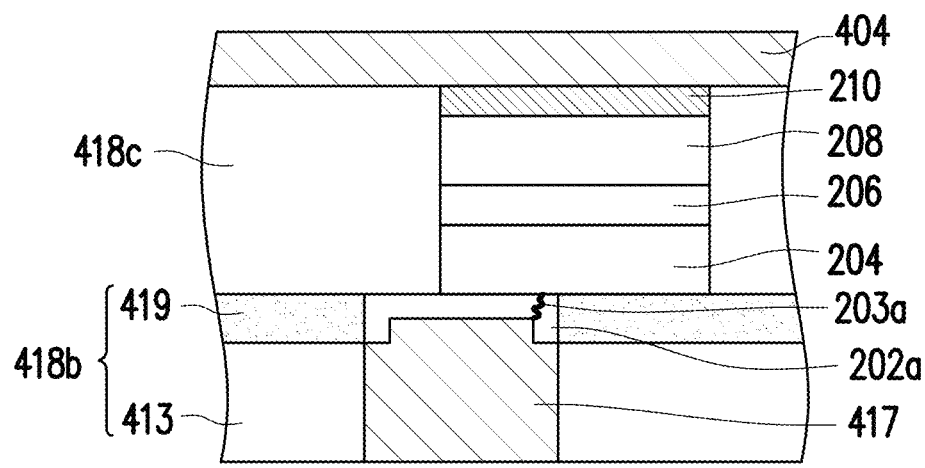

Referring to FIG. 9F, a filamentary bottom electrode 203a is formed within the buffer layer 202a after the formation of the interconnect structure 407. A memory device 20 including a memory stack MS4 is thus completed. In some embodiments, a voltage is applied to the memory device 20, so as to form the filamentary bottom electrode 203a within the buffer layer 202a. Specifically, the filamentary bottom electrode 203a is a conductive pathway constituted by oxygen vacancies of the metal oxide buffer layer 202a. The oxygen vacancies are generated within the metal oxide buffer layer 202a and form a filamentary conductive path serving a bottom electrode of the memory stack MS4. In some embodiments, the filamentary conductive path is formed around the turning point of the buffer layer 202a. In some embodiments, the applied voltage ranges from about 0.7 V to 2 V. In some embodiments, a heating operation is performed to the memory device 20, so as to facilitate the formation of the filamentary bottom electrode 203a. In some embodiments, the applied voltage ranges from about 0.7 V to 1 V or from about 0.8 V to 0.9 V at a temperature of about 200° C. to 500° C., such as 300° C. to 400° C. In some embodiments, the filamentary bottom electrode 203a is formed during the first firing or testing process.

Figure 10:
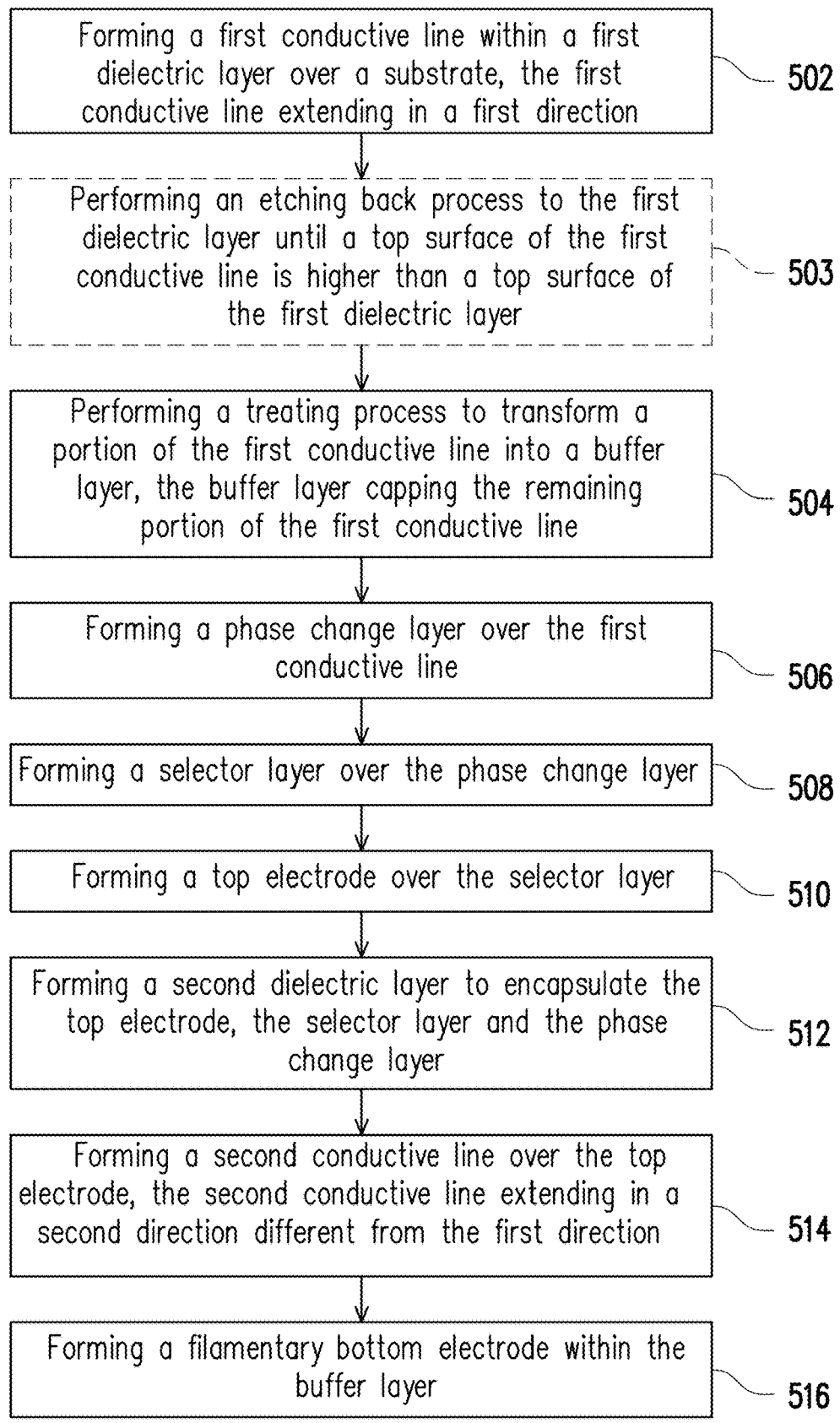
FIG. 10 illustrates a flow chart of a method of forming a memory device according to other embodiments of the present disclosure.

FIG. 10 illustrates a flow chart of a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 502, a first conductive line is formed within a first dielectric layer over a substrate, and the first conductive line extends in a first direction. FIG. 8A and FIG. 9A illustrate cross-sectional views corresponding to some embodiments of act 502. In some embodiments, forming a first conductive line within the first dielectric layer includes forming a first opening in the first dielectric layer, forming a first conductive material over the first dielectric layer filling the first opening, and performing a planarization process to the first conductive material by using the first dielectric layer as an etching mask, so as to form the first conductive line in the first opening. In some embodiments, a top surface of the first conductive line is substantially coplanar with a top surface of the first dielectric layer at act 502. The first dielectric layer may have a single-layer or multi-layer structure.

At act 503, an etching back process is performed to the first dielectric layer until a top surface of the first conductive line is higher than a top surface of the first dielectric layer. FIG. 9B illustrates a cross-sectional view corresponding to some embodiments of act 503. Act 503 is optional and may be omitted as needed.

At act 504, a treating process is performed to transform a portion of the first conductive line into a buffer layer, and the buffer layer caps the remaining portion of the first conductive line. FIG. 8B and FIG. 9C illustrate cross-sectional views corresponding to some embodiments of act 504. In some embodiments, the treating operation includes a wet oxidation process or an oxygen annealing process.

At act 506, act 508 and act 510, a phase change layer, a selector layer and a top electrode are sequentially formed over the buffer layer. FIG. 8C and FIG. 9D illustrate cross-sectional views corresponding to some embodiments of act 506, act 508 and act 510. In some embodiments, a phase change material, a selector material, a top electrode material and a mask layer are sequentially formed over the buffer layer, and the phase change material, the selector material and the top electrode material are patterned by using the mask layer as a mask, so as to form a memory stack. In some embodiments, a blocking layer (e.g., silicon nitride, silicon oxynitride, silicon carbide etc.) is optionally formed on sidewalls of the phase change layer, the selector layer and the top electrode, so as to block humility from entering the phase change layer. In some embodiments, an intermediate layer serving as a heater is formed between the phase change layer and the selector layer. In some embodiments, the sequence of forming the phase change material layer and the selector material layer may be exchanged. That is, the act 506 and act 508 may be exchanged as needed.

At act 512, a second dielectric layer is formed to encapsulate the top electrode, the selector layer and the phase change layer. FIG. 8D and FIG. 9E illustrate cross-sectional views corresponding to some embodiments of act 512. The second dielectric layer may have a single-layer or multi-layer structure.

At act 514, a second conductive line is formed over and in physical contact with the top electrode, and the second conductive line extends in a second direction different from the first direction. FIG. 8D to FIG. E and FIG. 9E illustrate cross-sectional views corresponding to some embodiments of act 514.

At act 516, a filamentary bottom electrode is formed within the buffer layer. FIG. 8F and FIG. 9F illustrate cross-sectional views corresponding to some embodiments of act 516. In some embodiments, forming the filamentary bottom electrode within the buffer layer includes applying a voltage of about 0.8 V to 2V to the memory device. In some embodiments, forming the filamentary bottom electrode within the buffer layer further includes performing a heating operation at a temperature of about 200° C. to 500° C.

The structures of the memory devices of some embodiments are described below with reference to FIG. 6, FIG. 7, FIG. 8F and FIG. 9F.

In some embodiments, a memory device 20 includes a memory stack MS3/MS4. The memory stack MS3/MS4 includes a conductive line 417, a phase change layer 204, a selector layer 208, a conductive line 404, a buffer layer 202/202a, a filament bottom electrode 203/203a and a top electrode 210. The conductive line 417 is disposed over a substrate 406 and extends in a first direction. The phase change layer 204 is disposed over the conductive line 417. The selector layer 208 is disposed over the phase change layer 204. An intermediate layer 206 is further include and disposed between the phase change layer 204 and the selector layer 208. The conductive line 404 is disposed over the selector layer 208 and extends in a second direction different from the first direction. The buffer layer 202 is disposed between the conductive line 417 and the phase change layer 204. The filament bottom electrode 203/203a is present within the buffer layer 202/202a. The top electrode 210 is disposed between the selector layer 208 and the conductive line 404.

In some embodiments, a central axis of the phase change layer 204 is aligned with a central axis of the buffer layer 202. In some embodiments, a central axis of the phase change layer 204 is misaligned with a central axis of the buffer layer 202a.

In some embodiments, the buffer layer 202/202a covers a top surface of the conductive line 417. In some embodiments, the buffer layer 202a further covers a portion of a side surface of the conductive line 417. In some embodiments, the filamentary bottom electrode 203a is disposed around a turning point of the buffer layer 202a.

In some embodiments, the phase change layer 204 completely covers the buffer layer 202. In some embodiments, the phase change layer 204 partially covers the buffer layer 202a.

In some embodiments, the buffer layer 202/202a includes metal oxide. In some embodiments, the filamentary bottom electrode 203/203a includes oxygen vacancies.

In the disclosure, a novel memory structure is proposed to confine the heat in PCRAM, so as to reduce operating current/voltage of PCRAM. The bottom electrode can be a filament. Such filament functions as a heater in some examples. The filamentary bottom electrode is beneficial to facilitate the phase change switching and improve the performance of the memory device.

The inventive concept of the tiny conductive path can be applied to another film layer serving as a heater.

Figure 11:
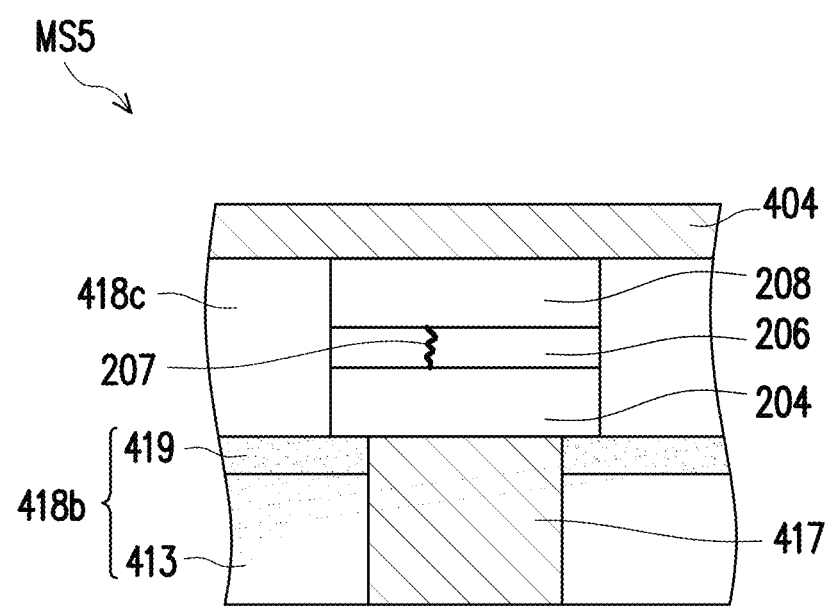
FIG. 11 illustrates a cross sectional view of a memory stack according to other embodiments of the present disclosure.
Figure 12:
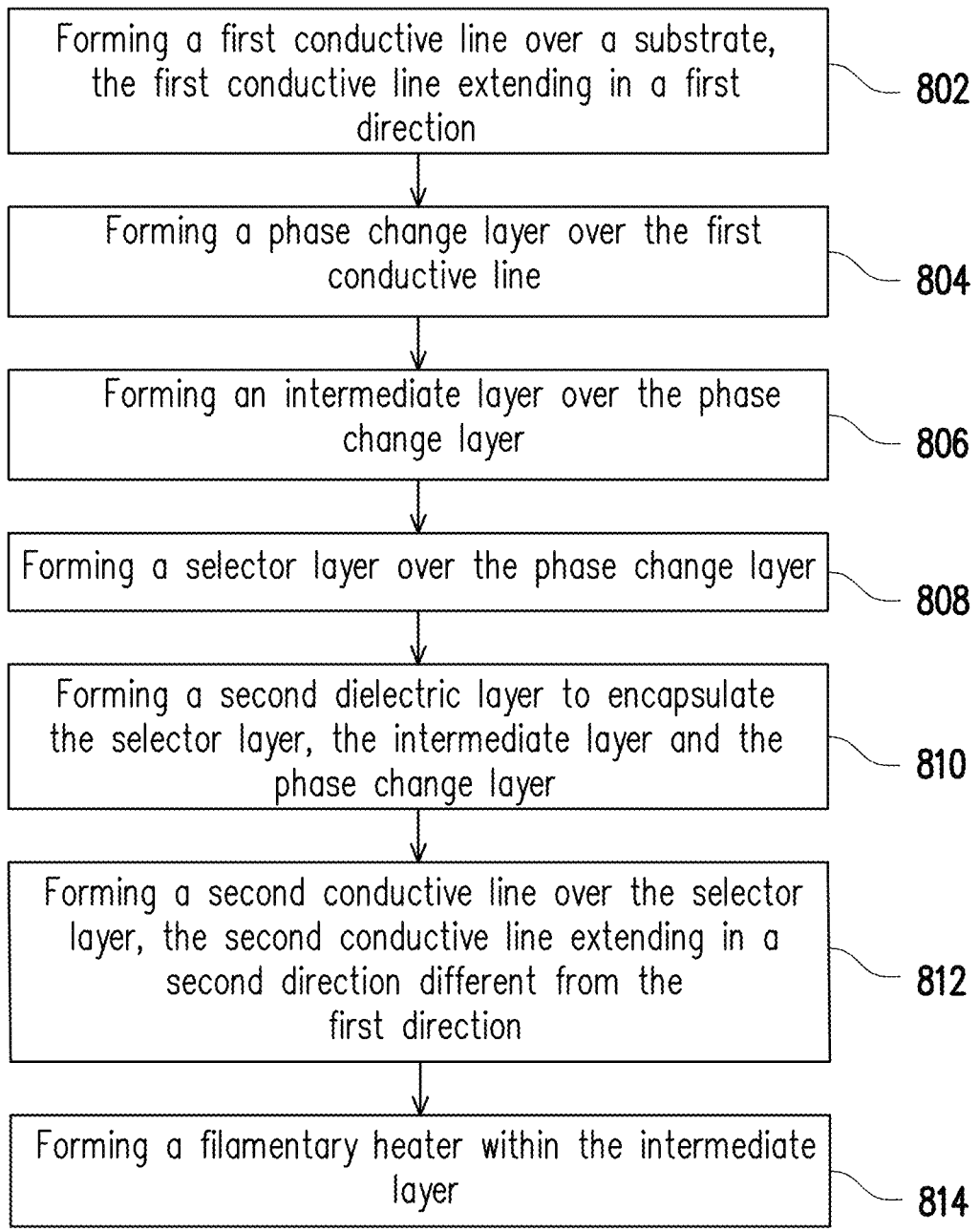
FIG. 12 illustrates a flow chart of a method of forming a memory device according to other embodiments of the present disclosure.

FIG. 11 illustrates a cross sectional view of a memory stack according to other embodiments of the present disclosure. FIG. 12 illustrates a flow chart of a method of forming a memory device according to other embodiments of the present disclosure. The memory stack MS5 may be included in the memory device 20 of FIG. 6, according to various embodiments of the present disclosure. The memory stack MS5 may be disposed between two overlapping conductive lines, such as conductive lines 417 and 404. With respect to the memory stack MS5, the conductive lines 417, 404 may be respectively referred to herein as a bottom conductive line 417 and a top conductive line 404. The memory stacks MS5 of FIG. 11 is similar to the memory stack MS3, with similar features of the memory stacks being labeled with similar numerical references and descriptions of the similar features are not repeated herein.

At act 802, a first conductive line 417 is formed over a substrate 406, and the first conductive line 417 extends in a first direction.

At act 804, act 806, and act 808, a phase change layer 204, an intermediate layer 206 and a selector layer 208 are sequentially formed over the first conductive line 417. In some embodiments, a phase change material, an intermediate layer, a selector material and a mask layer are sequentially formed over the buffer layer, and the phase change material, the intermediate layer and the selector material are patterned by using the mask layer as a mask, so as to form a memory stack. In some embodiments, a blocking layer (e.g., silicon nitride, silicon oxynitride, silicon carbide etc.) is optionally formed on sidewalls of the phase change layer, the intermediate layer and the selector layer, so as to block humility from entering the phase change layer. In some embodiments, the sequence of forming the phase change material layer and the selector material layer may be exchanged. That is, the act 804 and act 808 may be exchanged as needed.

At act 810, a second dielectric layer 418c is formed to encapsulate the selector layer 208, the intermediate layer 206 and the phase change layer 204.

At act 812, a second conductive line 404 is formed over the selector layer 208, and the second conductive line 404 extends in a second direction different from the first direction.

At act 814, a filamentary heater 207 is formed within the intermediate layer 206. In some embodiments, forming the filamentary heater 207 within the intermediate layer 206 includes applying a voltage of about 0.8 V to 2V to the memory device. In some embodiments, forming the filamentary heater 207 within the intermediate layer 206 further includes performing a heating operation at a temperature of about 200° C. to 500° C.

In some embodiments, a memory device 20 includes a memory stack MS5. The memory stack MS5 includes: a first conductive line 417 disposed over a substrate 406; a phase change layer 204 disposed over the conductive line 417; a selector layer 208 disposed over the phase change layer 204; a conductive line 404 disposed over the selector layer 208; an intermediate layer 206 disposed between the phase change layer 204 and the selector layer 208; and a filament heater 207 present within the intermediate layer 206.

In some embodiments, the first conductive line 417 serves a bottom electrode, and the second conductive line 404 serves a top electrode. In other embodiments, upon the process requirements, a bottom electrode may be inserted between the first conductive line 417 and the phase change layer 204, and a top electrode may be inserted between the second conductive line 404 and the selector layer 208.

In some embodiments, the intermediate layer 208 includes oxide of copper (Cu), tungsten (W), titanium (Ti), tantalum (Ta) or a suitable transition metal. For example, the intermediate layer 208 includes metal oxide, such as WO, CuO, or the like. In some embodiments, the filament heater 207 includes oxygen vacancies.

In accordance with some embodiments of the present disclosure, a method of forming a memory device includes the following operations. A first conductive plug is formed within a first dielectric layer over a substrate. A treating process is performed to transform a portion of the first conductive plug into a buffer layer, and the buffer layer caps the remaining portion of the first conductive plug. A phase change layer and a top electrode are sequentially formed over the buffer layer. A second dielectric layer is formed to encapsulate the top electrode and the underlying phase change layer. A second conductive plug is formed within the second dielectric layer and in physical contact with the top electrode. A filamentary bottom electrode is formed within the buffer layer.

In accordance with other embodiments of the present disclosure, a memory device includes: a first conductive plug disposed on a conductive line over a substrate; a phase change layer disposed over the first conductive plug; a buffer layer disposed between the first conductive plug and the phase change layer; a filamentary bottom electrode disposed within the buffer layer and in physical contact with the first conductive plug and the phase change layer; a top electrode disposed over the phase change layer; and a second conductive plug disposed over the top electrode.

In accordance with yet other embodiments of the present disclosure, a memory device includes: a first conductive line disposed over a substrate; a phase change layer disposed over the first conductive line; a selector layer disposed over the phase change layer; a second conductive line disposed over the selector layer; a buffer layer disposed between the first conductive line and the phase change layer; a filament bottom electrode present within the buffer layer; and a top electrode is disposed between the selector layer and the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first conductive feature disposed over a substrate;
   a memory layer disposed over the first conductive feature;
   a buffer layer disposed between the first conductive feature and the memory layer;
   a dielectric cap layer disposed aside the buffer layer, wherein the memory layer is in contact with the buffer layer and the dielectric cap layer;
   a bottom electrode disposed within the buffer layer and in physical contact with the first conductive feature and the memory layer; and
   a top electrode disposed over the memory layer,
   wherein a width of the memory layer is greater than a width of the buffer layer.

2. The memory device of claim 1, wherein the memory layer comprises a phase change layer.

3. The memory device of claim 1, wherein the bottom electrode is shaped like a filament.

4. The memory device of claim 1, wherein a central axis of the memory layer is aligned with a central axis of the buffer layer.

5. The memory device of claim 1, wherein a central axis of the memory layer is misaligned with a central axis of the buffer layer.

6. The memory device of claim 1, wherein a bottom surface of the dielectric cap layer is substantially flush with a lowermost bottom surface of the buffer layer.

7. The memory device of claim 1, wherein the buffer layer has a horizontal I-shape.

8. The memory device of claim 1, wherein the buffer layer has an inverted U-shape.

9. The memory device of claim 1, further comprising a second conductive feature disposed over the top electrode.

10. A memory device, comprising:
    a first conductive line disposed over a substrate;
    a buffer layer disposed over the first conductive line and capping a top corner of the first conductive line;
    a bottom electrode disposed within the buffer layer around the top corner of the first conductive line;
    a memory layer disposed over the buffer layer; and
    a top electrode disposed over the memory layer,
    wherein a width of the memory layer is greater than a width of the buffer layer.

11. The memory device of claim 10, further comprising a selector layer disposed between the memory layer and the top electrode.

12. The memory device of claim 11, further comprising an intermediate layer disposed between the memory layer and the selector layer.

13. The memory device of claim 11, further comprising a second conductive line disposed over the top electrode.

14. The memory device of claim 10, wherein a central axis of the memory layer is misaligned with a central axis of the buffer layer.

15. The memory device of claim 10, wherein the bottom electrode comprises oxygen vacancies.

16. The memory device of claim 10, wherein the buffer layer comprises metal oxide.

17. The memory device of claim 10, wherein the memory layer partially covers the buffer layer.

18. A memory device, comprising:
    a first conductive plug disposed over a substrate;
    a buffer layer disposed over the first conductive plug, wherein a sidewall of the first conductive plug is flush with a sidewall of the buffer layer;
    a bottom electrode disposed within the buffer layer and having a curvy sidewall;
    a memory layer disposed over the buffer layer; and
    a top electrode disposed over the selector layer,
    wherein a width of the memory layer is greater than a width of the buffer layer.

19. The memory device of claim 18, wherein the buffer layer has a flat bottom surface.

20. The memory device of claim 18, wherein the buffer layer has a stepped bottom surface.

* * * * *